(12) United States Patent
Hirashima et al.

(10) Patent No.: US 9,230,671 B2
(45) Date of Patent: Jan. 5, 2016

(54) OUTPUT CIRCUIT AND SEMICONDUCTOR STORAGE DEVICE

(71) Applicant: Kabushiki Kaisha Toshiba, Minato-ku (JP)

(72) Inventors: Yasuhiro Hirashima, Kawasaki (JP); Masaru Koyanagi, Ota-ku (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/200,446

(22) Filed: Mar. 7, 2014

(65) Prior Publication Data

US 2015/0009764 A1    Jan. 8, 2015

Related U.S. Application Data

(60) Provisional application No. 61/843,223, filed on Jul. 5, 2013.

(51) Int. Cl.

| | |
|---|---|
| *G11C 7/10* | (2006.01) |
| *G11C 16/26* | (2006.01) |
| *G11C 16/08* | (2006.01) |
| *G11C 16/10* | (2006.01) |
| *H03K 19/017* | (2006.01) |
| *H03K 19/01* | (2006.01) |
| *G11C 29/02* | (2006.01) |

(52) U.S. Cl.
CPC ............... *G11C 16/26* (2013.01); *G11C 16/08* (2013.01); *G11C 16/10* (2013.01); *G11C 7/1051* (2013.01); *G11C 29/022* (2013.01); *G11C 29/028* (2013.01); *H03K 19/01* (2013.01); *H03K 19/017* (2013.01)

(58) Field of Classification Search
CPC ..................................................... G11C 7/1051
USPC ........................................ 365/189.05; 326/87
See application file for complete search history.

(56) References Cited

U.S. PATENT DOCUMENTS

| | | | | |
|---|---|---|---|---|
| 5,034,629 | A * | 7/1991 | Kinugasa et al. | 326/27 |
| 5,218,239 | A * | 6/1993 | Boomer | 326/27 |
| 5,781,045 | A * | 7/1998 | Walia et al. | 327/108 |
| 6,313,671 | B1 * | 11/2001 | Le et al. | 327/112 |
| 6,445,224 | B1 * | 9/2002 | Fong | 327/108 |

* cited by examiner

*Primary Examiner* — Son Mai
(74) *Attorney, Agent, or Firm* — Oblon, McClelland, Maier & Neustadt, L.L.P.

(57) ABSTRACT

According to one embodiment, there is provided an output circuit including a driver transistor and a pre-driver circuit. The driver transistor is connected to an output terminal. The pre-driver circuit is configured to turn ON/OFF the driver transistor. The pre-driver circuit includes a first transistor, a second transistor, a third transistor. The first transistor is configured to control ON speed of the driver transistor. The second transistor is connected in parallel with the first transistor. The second transistor is configured to control ON speed of the driver transistor. The third transistor is connected in parallel with the first transistor and in series with the second transistor. The third transistor is configured to activate or deactivate the second transistor.

17 Claims, 17 Drawing Sheets

FIG.2
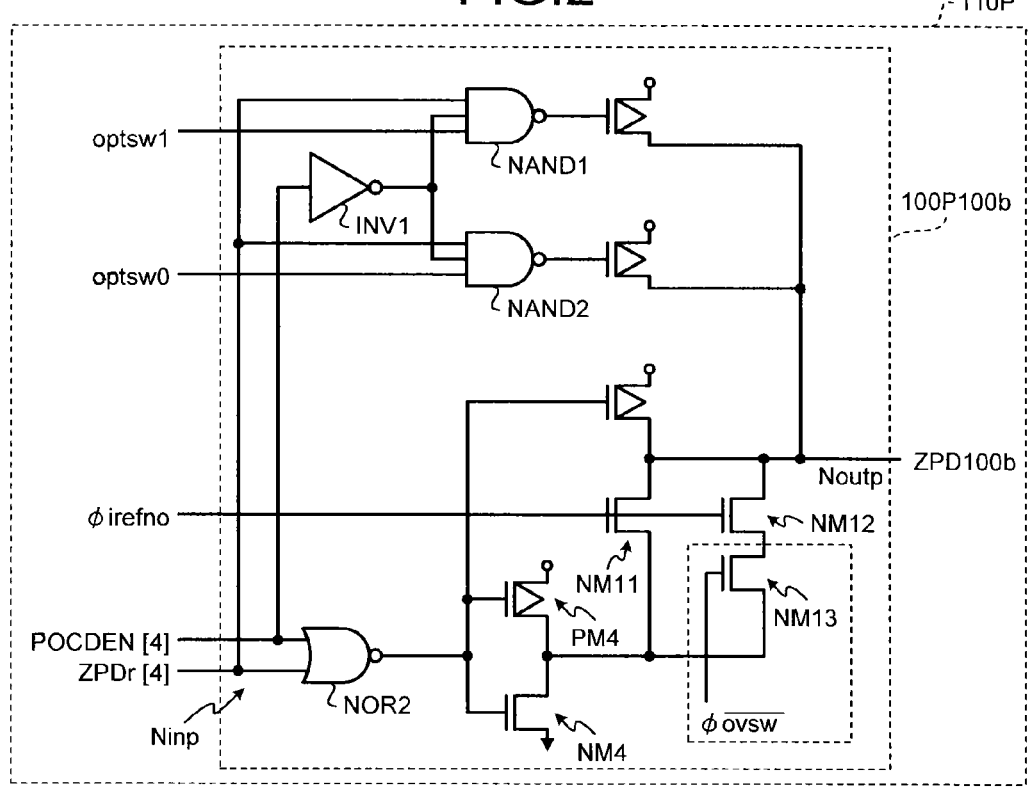
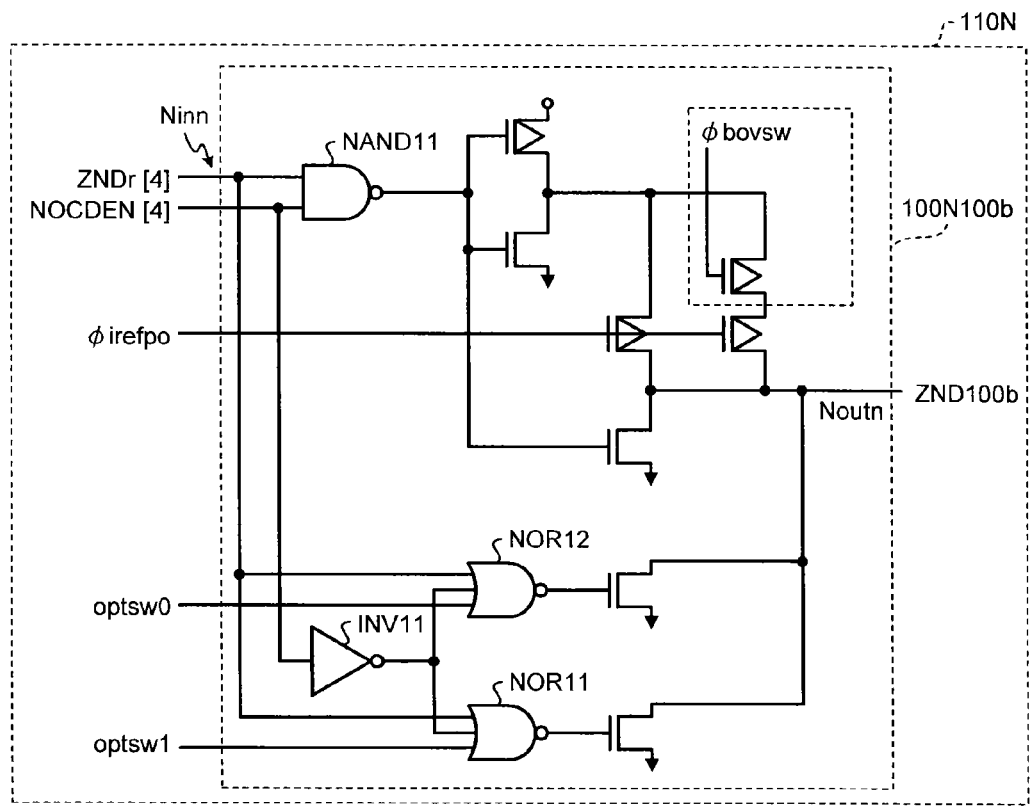

FIG.3
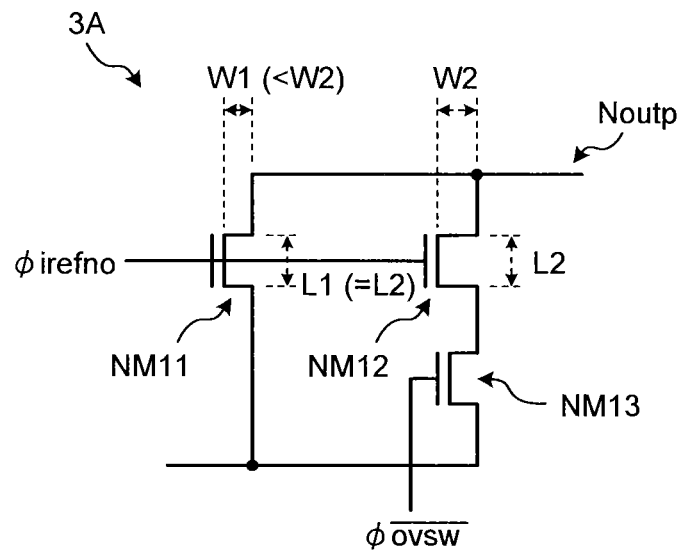
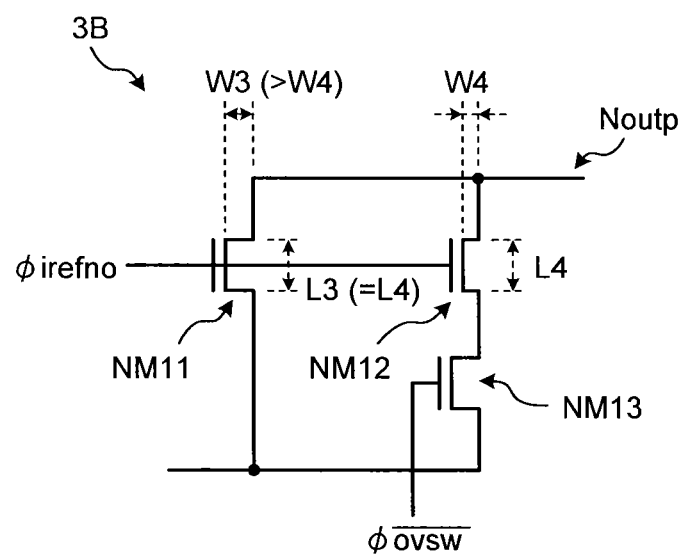

FIG.4
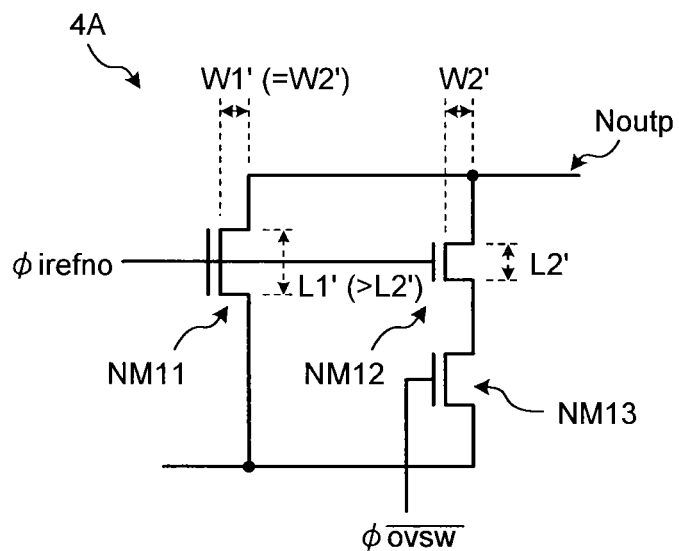
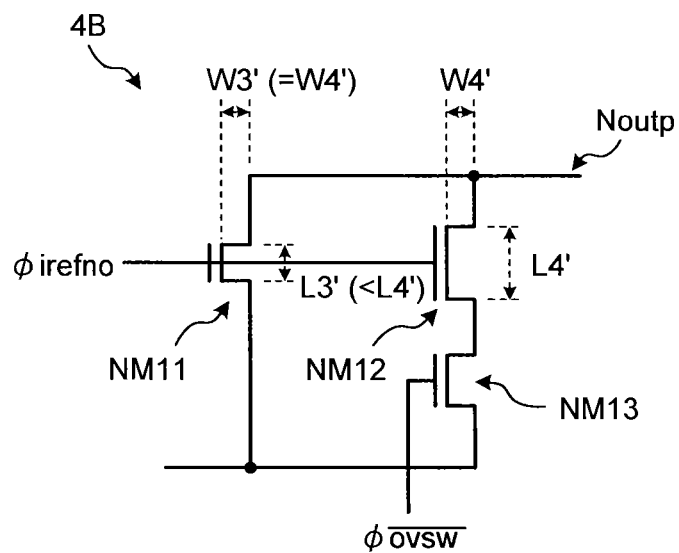

FIG.7
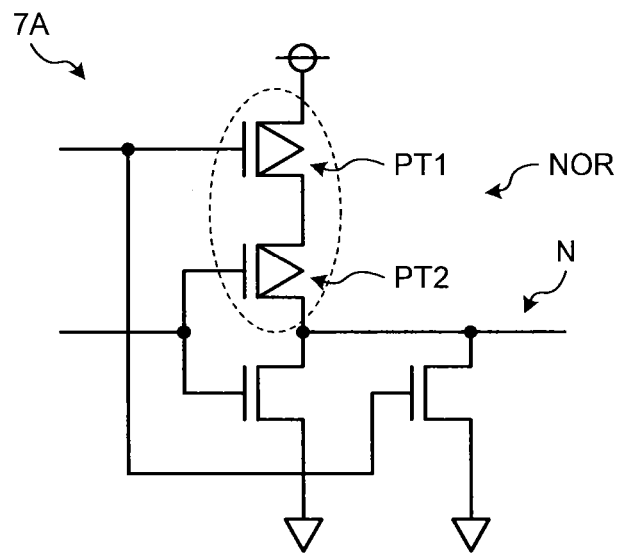
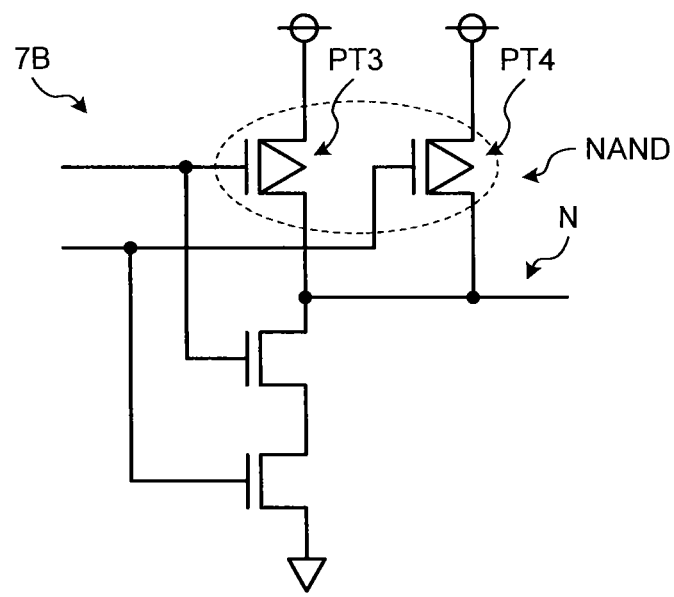

FIG.15
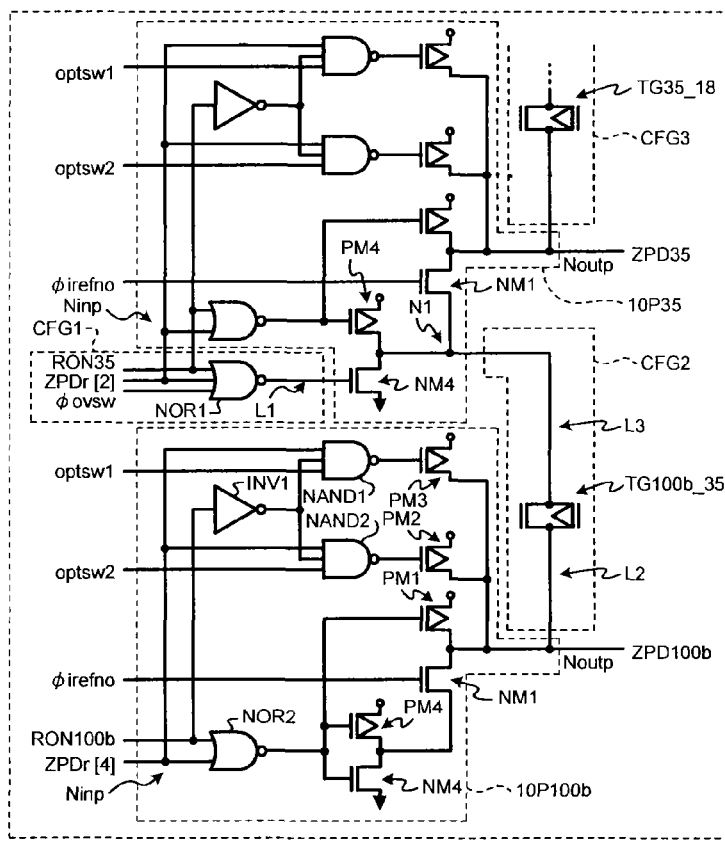
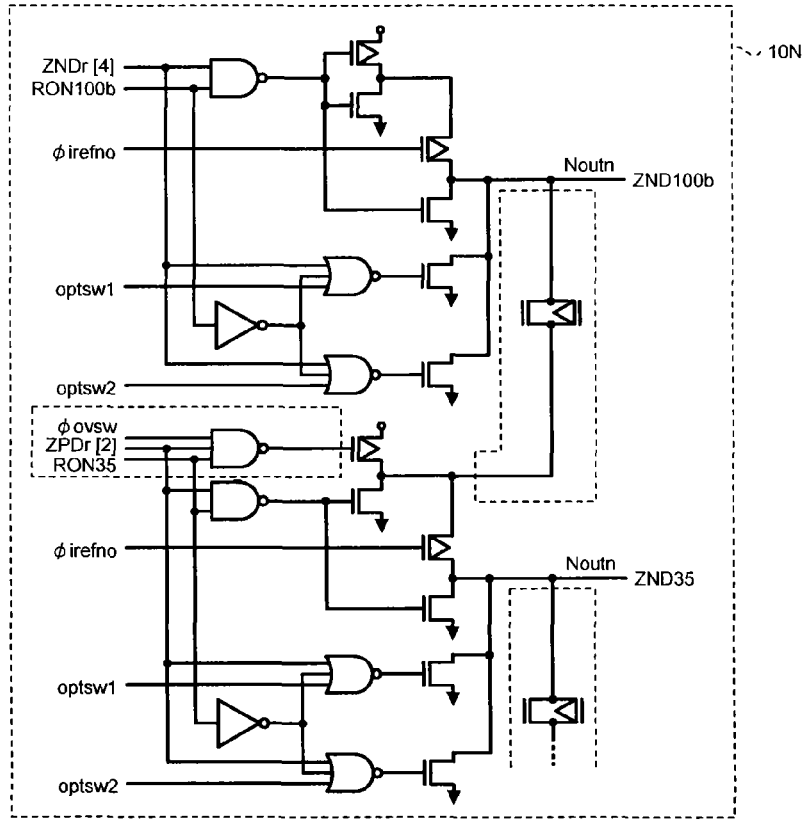

OUTPUT CIRCUIT AND SEMICONDUCTOR STORAGE DEVICE

CROSS-REFERENCE TO RELATED APPLICATIONS

This application is based upon and claims the benefit of priority from Provisional Application No. 61/843,223, filed on Jul. 5, 2013; the entire contents of which are incorporated herein by reference.

FIELD

Embodiments described herein relate generally to an output circuit and a semiconductor storage device.

BACKGROUND

A semiconductor chip including a NAND flash memory is sometimes configured so that the drivability can be selected at an output circuit. In this case, current flowing to the output circuit is desirably reduced.

BRIEF DESCRIPTION OF THE DRAWINGS

FIG. 2 is a view illustrating a configuration of a pre-driver circuit according to the first embodiment;
FIG. 3 is a view illustrating a part of the configuration of the pre-driver circuit according to the first embodiment;
FIG. 4 is a view illustrating a part of the configuration of the pre-driver circuit according to the first embodiment;
FIG. 7 is a view illustrating a configuration of an NOR gate according to the first embodiment and a configuration of a NAND gate according to the second embodiment;
FIG. 15 is a view illustrating a configuration of a pre-driver circuit according to the basic model.

DETAILED DESCRIPTION

In general, according to one embodiment, there is provided an output circuit including a driver transistor and a pre-driver circuit. The driver transistor is connected to an output terminal. The pre-driver circuit is configured to turn ON/OFF the driver transistor. The pre-driver circuit includes a first transistor, a second transistor, a third transistor. The first transistor is configured to control ON speed of the driver transistor. The second transistor is connected in parallel with the first transistor. The second transistor is configured to control ON speed of the driver transistor. The third transistor is connected in parallel with the first transistor and in series with the second transistor. The third transistor is configured to activate or deactivate the second transistor.

Exemplary embodiments of an output circuit will be explained below in detail with reference to the accompanying drawings. The present invention is not limited to the following embodiments.

(First Embodiment)

Figure 11:
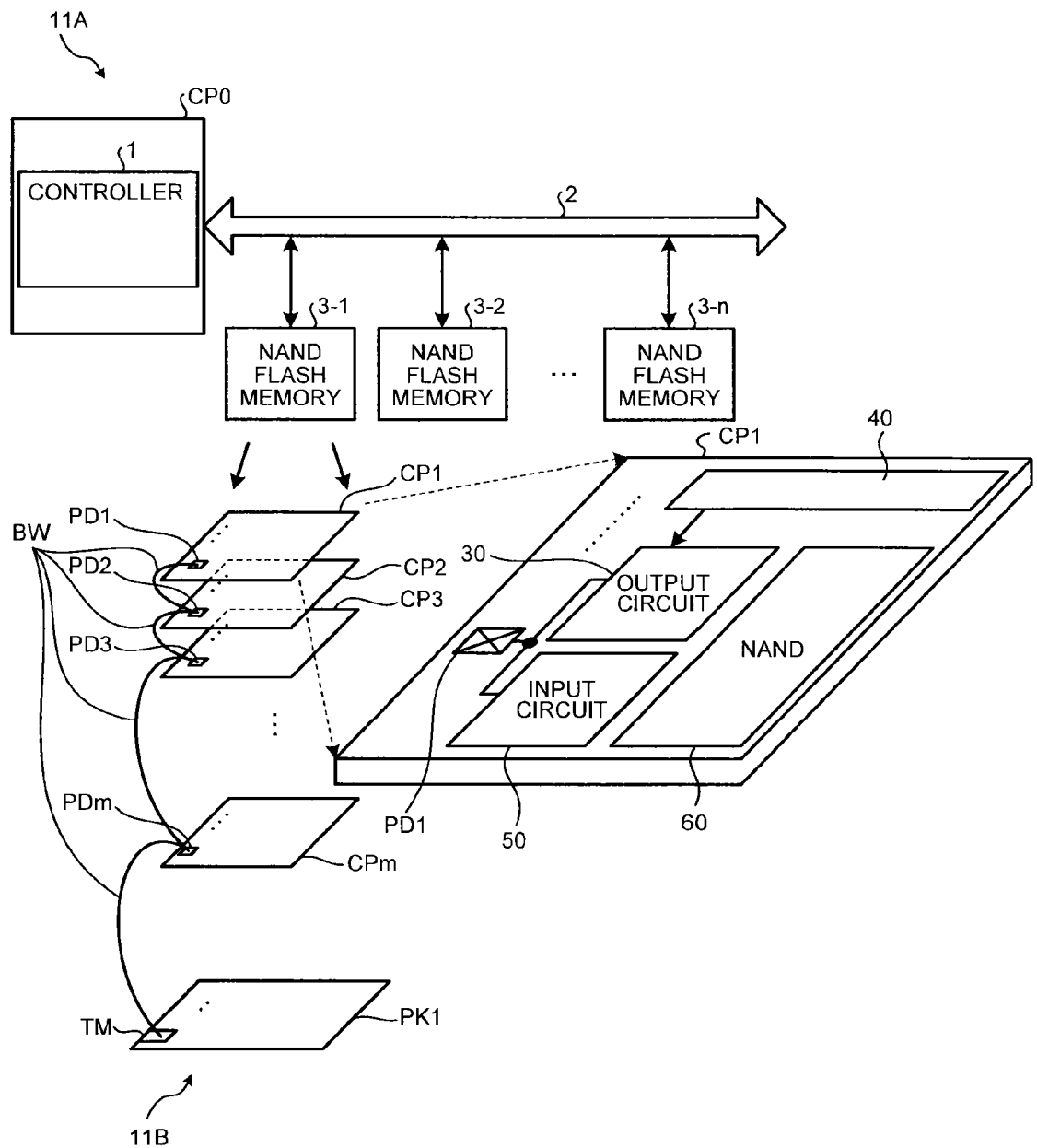
FIG. 11 is a view illustrating a configuration of a semiconductor storage device applied with an output circuit according to a basic model.
Figure 12:
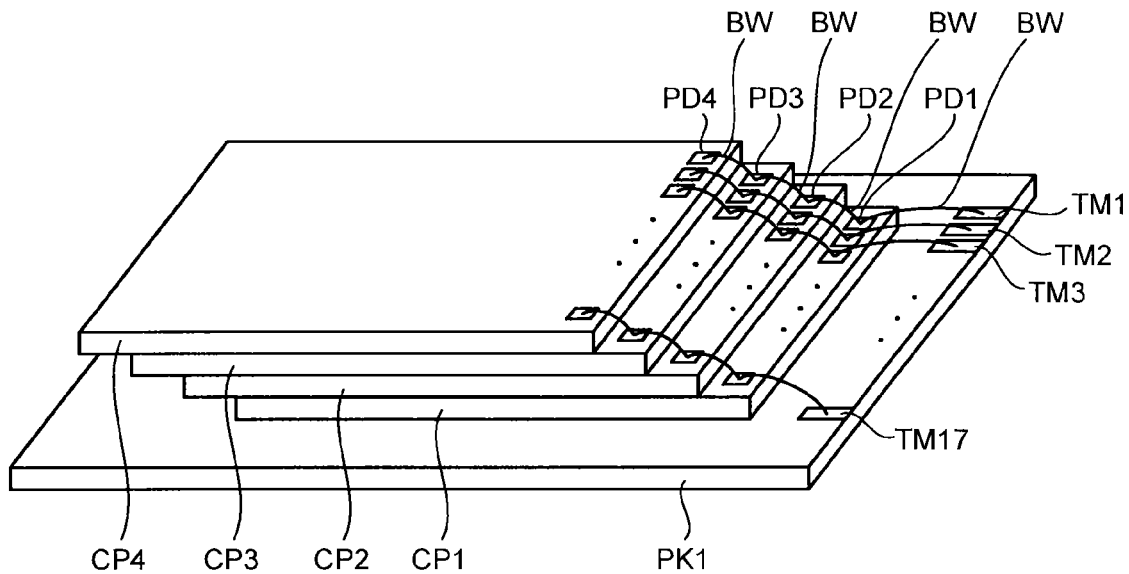
FIG. 12 is a view illustrating a configuration of a NAND flash memory applied with the output circuit according to the basic model.

An output circuit 30 according to a basic model will be described before describing an output circuit 130 according to the embodiment. First, a semiconductor storage device SD applied with the output circuit 30 according to the basic model will be described using FIG. 11 and FIG. 12. In FIG. 11, 11A is a block diagram illustrating a schematic configuration of a semiconductor storage device applied with the output circuit according to the basic model, and 11B of FIG. 11 is a view illustrating an internal configuration of a NAND flash memory in the semiconductor storage device. FIG. 12 is a perspective view illustrating a mounting configuration of the NAND flash memory in the semiconductor device.

As illustrated in 11A of FIG. 11, the semiconductor storage device SD includes a controller 1, a channel (transmission path) 2 and n (n is an integer greater than or equal to two) NAND flash memories 3-1 to 3-n. The semiconductor storage device SD is used, for example, as a storage device such as a memory card, an SSD, and the like.

The controller 1 is implemented in a semiconductor chip CP0, and performs control of the NAND flash memories 3-1 to 3-n through the channel (transmission path) 2. The control of the NAND flash memories 3-1 to 3-n includes, for example, read/write control of the NAND flash memories 3-1 to 3-n, block selection, error correction, wear levering, and the like.

The NAND flash memories 3-1 to 3-n are connected to the controller 1 in parallel with each other by way of the channel (transmission path) 2. For example, the NAND flash memory 3-1 includes m (m is an integer greater than or equal to two) semiconductor chips CP1 to CPm, and the semiconductor chips CP1 to CPm include pad electrodes PD1 to PDm. As illustrated in 11B of FIG. 11, for example, the semiconductor chip CP1 includes an input circuit 50, the output circuit 30, a control circuit 40, and a memory main unit 60. The memory main unit 60 may include, for example, a unit cell array, a decoder, a sense amplifier, a charge pump circuit, a page buffer, and the like.

The input circuit 50 receives signals such as write data, address, command, and the like transmitted from the controller 1 via the channel 2. The input circuit 50 buffers the received signal with an input buffer, and also transfers the received signal to the memory main unit 60, the control circuit 40, and the like.

When receiving a command from the controller 1, the control circuit 40 generates a control signal corresponding to the command, and provides the control signal to the input circuit 50 and/or the output circuit 30.

The output circuit 30 buffers readout data read out from the memory main unit 60, and the like with an output buffer, and transmits the readout data to the controller 1 via the channel 2.

Each of the semiconductor chips CP2 to CPm also includes the input circuit 50, the output circuit 30, the control circuit 40, and the memory main unit 60. In 11B of FIG. 11, the configuration of the semiconductor chip CP1 is illustrated as an internal configuration of the NAND flash memory 3-1.

The m semiconductor chips CP1 to CPm are mounted on one semiconductor package PK1. An external terminal TM of the semiconductor package PK1 is shared among the pad electrodes PD1 to PDm of the m semiconductor chips CP1 to CPm.

A method for mounting the semiconductor chips CP1 to CPm on the semiconductor package PK1 may be a method of stacking the semiconductor chips CP1 to CPm, or may be a method of arraying the semiconductor chips CP1 to CPm on the same plane. The semiconductor chips CP1 to CPm may be mounted face-down or may be mounted face-up. A method for sharing one external terminal TM among the m pad electrodes PD1 to PDm includes connecting the m pad electrodes PD1 to PDm and the one external terminal TM with a bonding wire BW. Alternatively, the semiconductor chips CP1 to CPm may be flip mounted, and the pad electrodes PD1 to PDm and the external terminal TM may be connected to each other by way of bump electrodes formed on the pad electrodes PD1 to PDm. Furthermore, a through-electrode may be formed in the semiconductor chips CP1 to CPm, and the pad electrodes PD1 to PDm and the external terminal TM may be connected to each other by way of the through-electrode.

For example, the semiconductor chips CP1 to CP4 are mounted in a mode illustrated in FIG. 12 in the NAND flash memory 3-1. The semiconductor chips CP1 to CP4 respectively includes the pad electrodes PD1 to PD4. The pad electrodes PD1 to PD4 can be used, for example, as an address terminal, a read/write terminal, a chip select terminal, or a data terminal. The semiconductor package PK1 is formed with external terminals TM1 to TM17. When mounting four semiconductor chips CP1 to CP4 on the semiconductor package PK1 in a stacked manner, the semiconductor chips CP1 to CP4 can be stacked in a shifted manner so that the pad electrodes PD1 to PD4 are exposed. The pad electrodes PD1 to PD4 are commonly connected to the external terminal TM1, for example, by way of the bonding wire BW, so that the one external terminal TM1 can be shared among the pad electrodes PD1 to PD4 of the four semiconductor chips CP1 to CP4.

Although not illustrated, the semiconductor chip CP0 implemented with the controller 1 is also mounted in the semiconductor package.

The NAND flash memory 3 is used in a wide range of applications. The NAND flash memory 3 takes various mounting configurations in accordance with the application in which it is used. For example, the number of chips to be stacked is variously changed, and the load and the wiring length of the channel (transmission path) 2 are variously changed in the NAND flash memory 3. In other words, the load by the stacking of the NAND flash memory 3, the mode of the channel (transmission path) 2, the transmission speed of the channel (transmission path) 2, and the load of the semiconductor chip CP0 of the controller 1 may be variously changed.

In this case, if the drivability of the output circuit 30 is fixed, the drivability of the output circuit 30 tends to easily deviate from the appropriate range, and there is a possibility that the output circuit 30 is not able to appropriately transmit signals to the controller 1. If the drivability of the output circuit 30 is faster than the appropriate range, for example, over-shoot may occur when the signal transitions from L level to H level, which may possibly cause hunching in which H level and L level are frequently repeated. If the drivability of the output circuit 30 is slower than the appropriate range, on the other hand, for example, the H level may not be reached within a required time even when attempting to transition the signal from L level to H level.

Thus, in the basic model, the output circuit 30 can select the drivability so as to be able to adjust the drivability within the appropriate range corresponding to the respective usage situation. For example, ON resistance of the driver transistor in the output circuit 30 may be prepared in plurals, so that selection can be made from the plurality of ON resistances (ON resistance selecting function). Furthermore, for example, a through-rate of the control signal for turning ON/OFF the driver transistor in the output circuit 30 may be controlled (through-rate controlling function). Moreover, for example, a plurality of driver transistors may be prepared in the output circuit 30, and the plurality of driver transistors may be turned ON in a time division manner (time-division output function). The ON resistance is selected by a user of the semiconductor storage device SD by inputting a parameter along with a command from the outside of the semiconductor storage device SD, for example.

Figure 13:
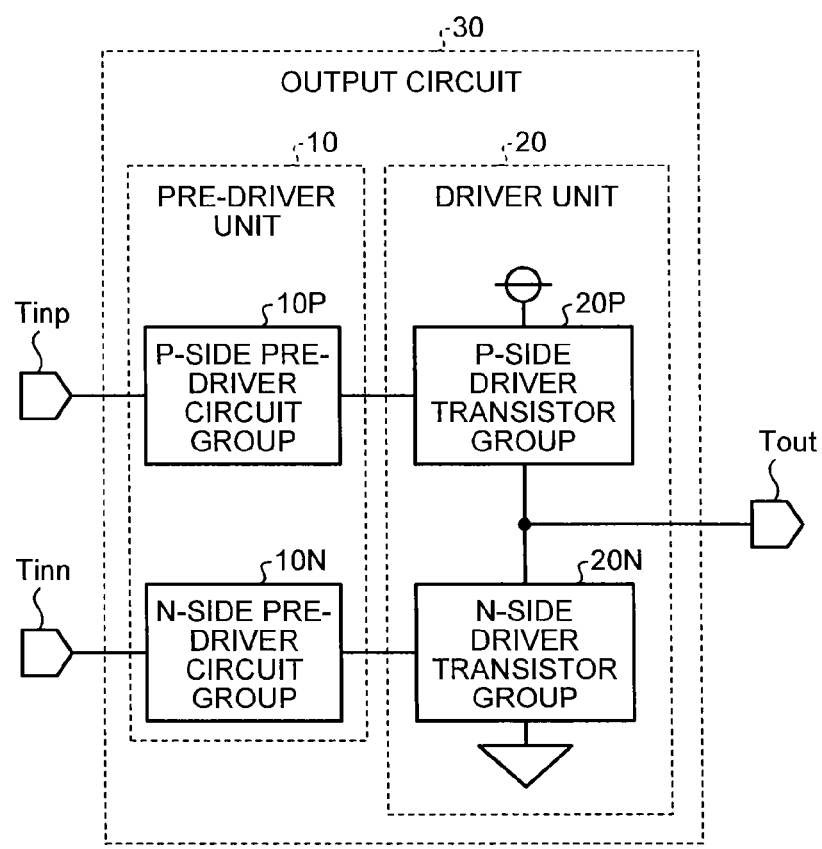
FIG. 13 is a view illustrating a configuration of the output circuit according to the basic model.
Figure 14:
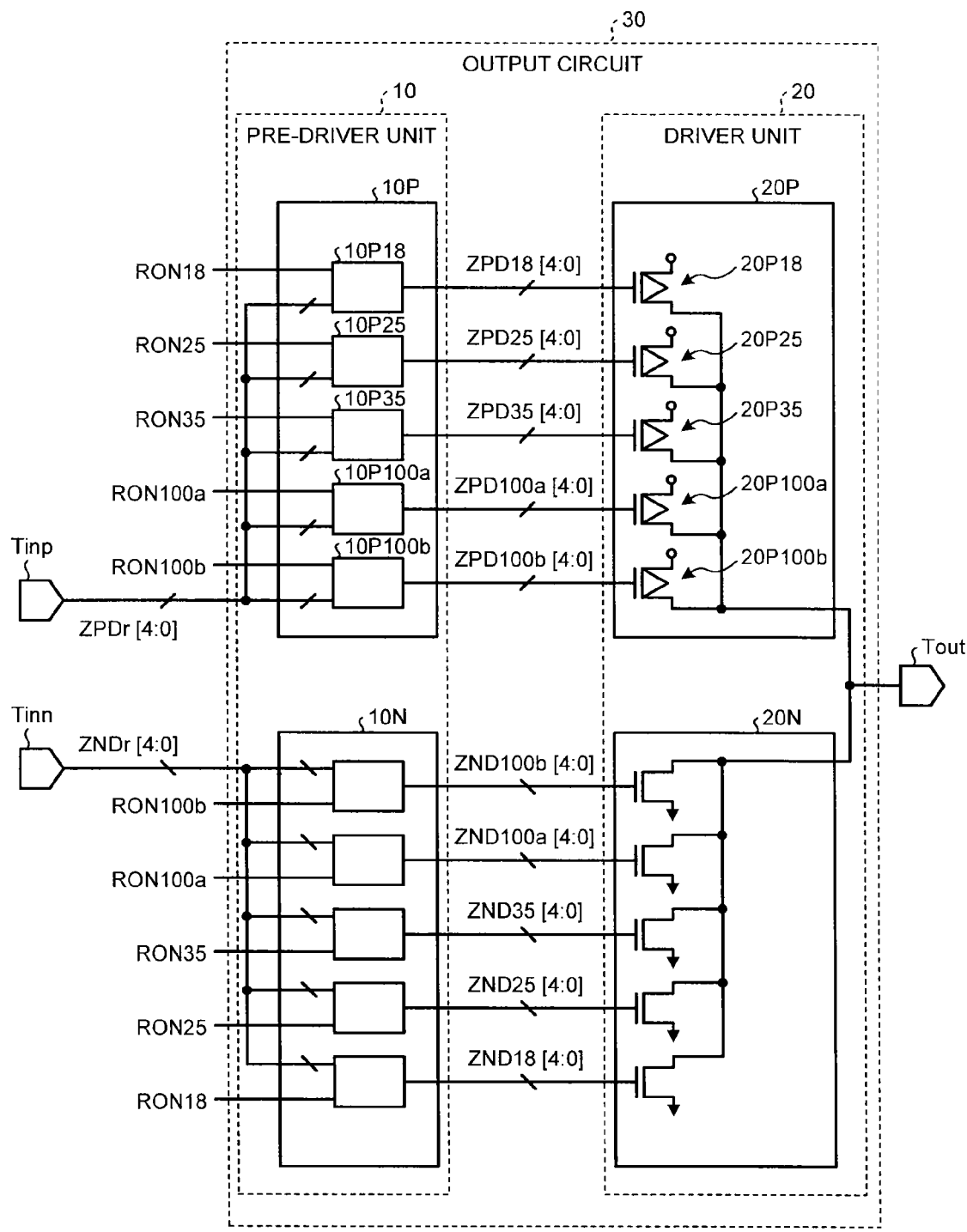
FIG. 14 is a view illustrating the configuration of the output circuit according to the basic model.

Specifically, as illustrated in FIG. 13 and FIG. 14, the output circuit 30 includes a pre-driver unit 10 and a driver unit 20. FIG. 13 and FIG. 14 are views illustrating a configuration of the output circuit 30, respectively.

The driver unit 20 is arranged between the pre-driver unit 10 and an output terminal Tout. The output terminal Tout is electrically connected to the pad electrode (e.g., pad electrode PD1 illustrated in FIG. 11). The driver unit 20 includes a P-side driver transistor group 20P and an N-side driver transistor group 20N.

The P-side driver transistor group 20P includes a plurality of driver transistors 20P18 to 20P100$b$.

In this case, for example, the following equation 1 is satisfied assuming the ON resistances of the driver transistors 20P18, 20P25, 20P35, 20P100$a$, 20P100$b$ are Rp18, Rp25, Rp35, Rp100$a$, Rp100$b$, respectively.

only $Rp100b$ is ON=>100(Ω)

$Rp100b$ and $Rp100a$ are ON=>50(Ω)

$Rp100b$,$Rp100a$, and $Rp35$ are ON=>35(Ω)

$Rp100b$,$Rp100a$,$Rp35$, and $Rp25$ are ON=>25(Ω)

$Rp100b$,$Rp100a$,$Rp35$,$Rp25$, and $Rp18$ are ON=>18 (Ω)    Equation 1

The N-side driver transistor group 20N has an opposite conductivity-type, and is accordingly arranged symmetric to the P-side driver transistor group 20P. Other aspects of the N-side driver transistor group 20N are similar to the P-side driver transistor group 20P.

The pre-driver unit 10 is arranged between input terminals Tinp, Tinn and the driver unit 20. The pre-driver unit 10 includes a P-side pre-driver circuit group 10P and an N-side pre-driver circuit group 10N.

The P-side pre-driver circuit group 10P includes a plurality of pre-driver circuits 10P18 to 10P100$b$. The plurality of pre-driver circuits 10P18 to 10P100$b$ corresponds to the plurality of driver transistors 20P18 to 20P100$b$. Each of the pre-driver circuits 10P18 to 10P100$b$ turns ON/OFF the corresponding driver transistors 20P18 to 20P100$b$ based on a transfer control signal and an ON resistance control signal provided from the control circuit 40 (see FIG. 11). The transfer control signal is a signal corresponding to a signal to be output from the output terminal Tout. The ON resistance control signal is a signal for controlling the ON resistance of the P-side driver transistor group 20P, and is a signal that specifies an ON resistance to be used in the plurality of ON resistances.

For example, the pre-driver circuit 10P18 generates a drive control signal ZPD18[4:0] based on the transfer control signal ZPDr[0] and the ON resistance control signal RON18, and provides the drive control signal ZPD18[4:0] to a gate of the driver transistor 20P18. The driver transistor 20P18 is turned ON when the drive control signal ZPD18[4:0] of active level is provided to the gate.

For example, the pre-driver circuit 10P100b generates a drive control signal ZPD100b[4:0] based on the transfer control signal ZPDr[4] and the ON resistance control signal RON100b, and provides the drive control signal ZPD100b[4:0] to a gate of the driver transistor 20P100b. The driver transistor 20P100b is turned ON when the drive control signal ZPD100b[4:0] of active level is provided to the gate.

In other words, the control circuit 40 (see FIG. 11) generates the ON resistance control signal in accordance with the command from the controller 1, and provides the same to the pre-driver circuits 10P18 to 10P100b. The control circuit 40 thus realizes the ON resistance selecting function of selecting the ON resistance through the pre-driver circuits 10P18 to 10P100b. The control circuit 40 can select two or more ON resistances as the ON resistance to be used among the plurality of ON resistances.

With regards to the ON resistance selecting function, the N-side pre-driver circuit group 10N has an opposite conductivity-type and is accordingly arranged symmetric to the P-side pre-driver circuit group 10P. Other aspects of the N-side pre-driver circuit group 10N are similar to the P-side pre-driver circuit group 10P.

The P-side pre-driver circuit group 10P is configured as illustrated in FIG. 15 to realize the through-rate controlling function.

For example, the pre-driver circuit 10P100b includes a transistor NM1 for through-rate control of when turned ON. The transistor NM1 controls the ON speed of the driver transistor 20P100b (see FIG. 14). The transistor NM1 is electrically connected between an input node Ninp and an output node Noutp. The transistor NM1 has the drain connected to the output node Noutp, and the source connected to the input node Ninp through the transistors NM4, PM4 and the NOR gate NOR2. The transistor NM1 receives a through-rate control signal φirefno at the gate from the control circuit 40. The through-rate control signal φirefno has an intermediate potential of a reference potential (e.g., ground potential) VSS and a power supply potential VDD.

The transistor NM1 thus becomes a half-ON state when receiving the through-rate control signal φirefno of intermediate potential at the gate, and equivalently functions as a resistor. In this case, the slope of rise/fall of the gate potential of the driver transistor 20P100b is adjusted through the transistor NM1, and the ON speed of the driver transistor 20P100b is adjusted. For example, compared to when the potential (intermediate potential) of the through-rate control signal φirefno is higher, the rise/fall of the gate potential of the driver transistor 20P100b becomes gradual as the load of the resistor is applied unnecessarily, and the ON speed of the driver transistor 20P100b becomes slower when the intermediate potential is lower.

In other words, the control circuit 40 (see FIG. 11) adjusts the level of the intermediate potential, generates the through-rate control signal that controls the through-rate of the drive control signal, and provides the through-rate control signal to the pre-driver circuit 10P100b according to the command from the controller 1, for example. The control circuit 40 thereby controls the through-rate through the pre-driver circuit 10P100b.

In order to control the through-rate of when turned OFF, the pre-driver circuit 10P100b includes transistors PM1 to PM3, NAND gates NAND1, NAND2, and an inverter INV1. The other pre-driver circuits 10P18 to 10P100a of the P-side pre-driver circuit group 10P are similar to the pre-driver circuit 10P100b. For example, the dimension (=W/L) of the transistor NM1 is the same for the plurality of pre-driver circuits 10P18 to 10P100b.

Furthermore, with regards to the through-rate controlling function, the N-side pre-driver circuit group 10N has an opposite conductivity-type and is accordingly arranged symmetric to the P-side pre-driver circuit group 10P, and has the NOR gate and the NAND gate interchanged with each other. Other aspects of the N-side pre-driver circuit group 10N are similar to the P-side pre-driver circuit group 10P.

The P-side pre-driver circuit group 10P is configured as illustrated in FIG. 15 to realize the time division outputting function.

In the P-side pre-driver circuit group 10P, the plurality of pre-driver circuits 10P18 to 10P100b (see FIG. 14) outputs the drive control signals of active level in a time division manner. For example, when all of the plurality of ON resistances R18 to R100b are selected and the time division outputting function is activated, the P-side pre-driver circuit group 10P outputs the drive control signals of active level sequentially in a manner of pre-driver circuit 10P100b→pre-driver circuit 10P35→pre-driver circuit 10P18, and also outputs the drive control signals of active level sequentially in a manner of pre-driver circuit 10P100b→pre-driver circuit 10P35.

For instance, the P-side pre-driver circuit group 10P includes a configuration CFG1, a configuration CFG2, and a configuration CFG3. The configuration CFG1 activates/non-activates the time division outputting function. The configuration CFG2 causes a cooperative operation of the pre-driver circuit 10P100b→pre-driver circuit 10P35. The configuration CFG3 causes a cooperative operation of the pre-driver circuit 10P35→pre-driver circuit 10P18.

In the configuration CFG1, the output side of the NOR gate NOR1 is connected to the gate of the transistor NM4 by way of a line L1. The NOR gate NOR1 performs an NOR operation of the transfer control signal ZPDr[2], the ON resistance control signal RON35, and a time division control signal φovsw, and outputs the operation result to the gate of the transistor NM4 via the line L1.

For instance, when receiving the time division output control signal φovsw of active level (e.g., H level) from the control circuit 40, the NOR gate NOR1 turns OFF the transistor NM4. When the transistor NM4 is turned OFF, via the node N1, cooperative operation of the pre-driver circuit 10P100b and the pre-driver circuit 10P35 is possible. When receiving the time division output control signal φovsw of non-active level (e.g., L level) from the control circuit 40, the NOR gate NOR1 turns ON the transistor NM4. When the transistor NM4 is turned ON, the node N1 becomes L level, and cooperative operation of the pre-driver circuit 10P100b and the pre-driver circuit 10P35 becomes not to be performed.

In the configuration CFG2, one end of a transfer gate TG100b_35 is connected to the output node Noutp of the pre-driver circuit 10P100b by way of a line L2. The other end of the transfer gate TG100b_35 is connected to the node N1 of the pre-driver circuit 10P35 by way of a line L3. The control circuit 40 maintains the transfer gate TG100b_35 in the ON state during a period of activating the time division outputting function.

For example, when the drive control signal ZPD100b output from the output node Noutp of the pre-driver circuit 10P100b lowers from H level to L level, the L level is transmitted to the node N1 via the line L2, the transfer gate TG100b_35, and the line L3. Accordingly, the transistor NM1 becomes the half-ON state, and the pre-driver circuit 10P35 starts to operate. In other words, the drive control signals of active level are sequentially output in a manner of the pre-driver circuit 10P100b→pre-driver circuit 10P35 (see 16A of FIG. 16). Although not illustrated, a configuration similar to the configuration CFG2 is also provided with respect to the pre-driver circuit 10P18.

In the configuration CFG3 as well, the transfer gate TG35_18 is similar to the transfer gate TG100b_35.

Figure 16:
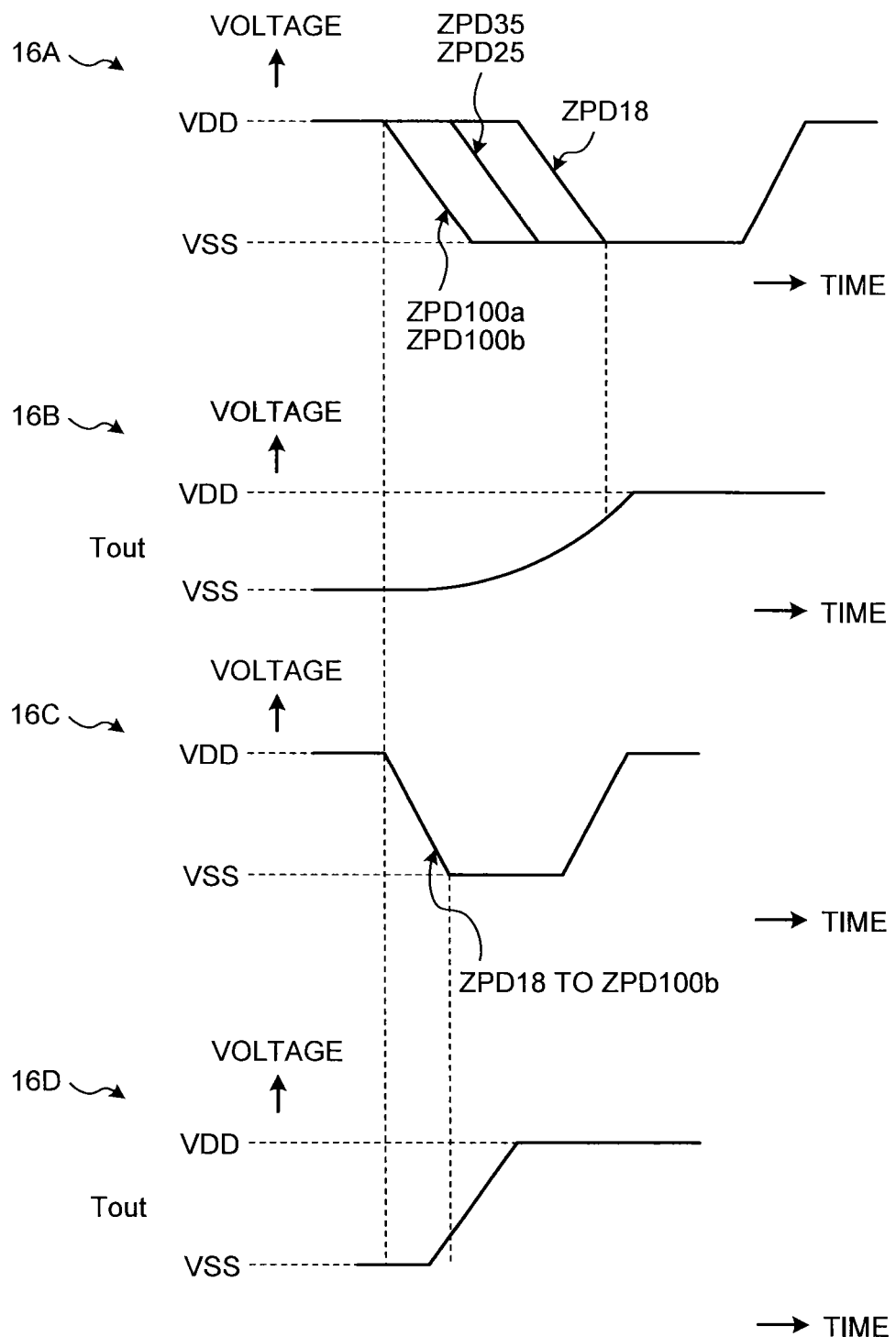
FIG. 16 is a view illustrating an operation of the output circuit according to the basic model.

As illustrated in 16A of FIG. 16, when the time division outputting function is activated, the P-side pre-driver circuit group 10P outputs the drive control signals of active level sequentially in a manner of pre-driver circuit 10P100b, 10P100a→pre-driver circuit 10P35, 10P25→pre-driver circuit 10P18. The drivability of the P-side driver transistor group 20P thus enhances in a step-wise manner. As a result, the signal output from the output terminal Tout becomes a gradually rising waveform, as illustrated in 16B of FIG. 16.

In the P-side pre-driver circuit group 10P, the plurality of pre-driver circuits 10P18 to 10P100b collectively (e.g., simultaneously) outputs the drive control signals of active level, as illustrated in 16C of FIG. 16, when the time division outputting function is non-activated. The drivability of the P-side driver transistor group 20P thus enhances collectively. As a result, the waveform of the signal output from the output terminal Tout becomes a steeply rising waveform, as illustrated in 16D of FIG. 16, for example.

As such, in the basic model, the configuration of the output circuit 30 tends to become complex since the output circuit 30 has extensive functions (ON resistance selecting function, through-rate controlling function, time division outputting function). For example, as illustrated in FIG. 15, the number of transistors and the number of wiring tend to become large, and thus the capacity load of the transistor and the capacity load of the wiring tend to be large, respectively, and a great amount of charging/discharging with respect to the capacity load is required, thus possibly increasing the current flowing to the output circuit 30.

Figure 1:
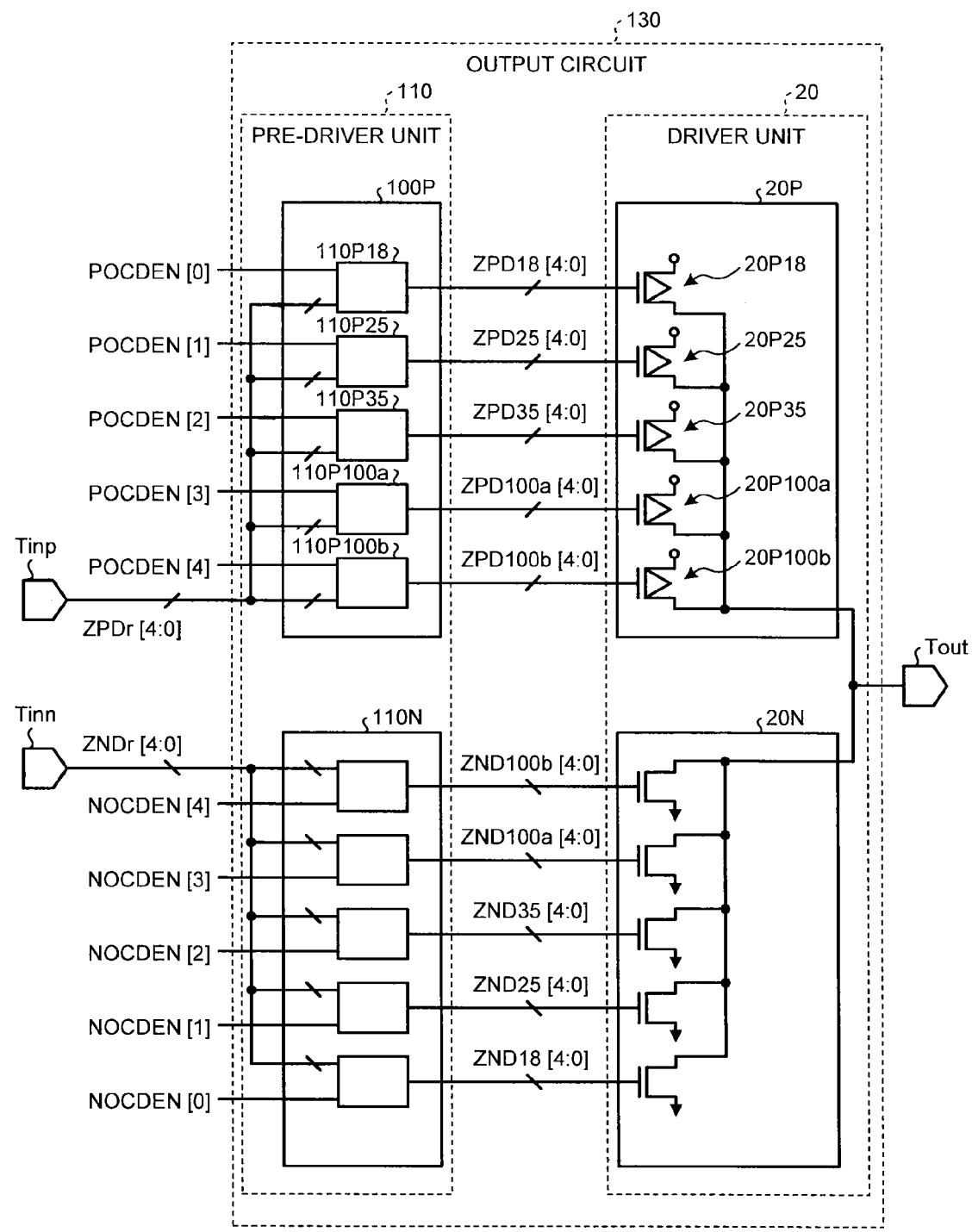
FIG. 1 is a view illustrating a configuration of an output circuit according to a first embodiment.

In the first embodiment, therefore, the configuration of the output circuit 130 is devised to realize the time division outputting function with a simple configuration, as illustrated in FIG. 1. With this configuration, the current flowing to the output circuit 130 thus can be reduced. Hereinafter, portions different from the basic model will be centrally described.

Specifically, the output circuit 130 includes a pre-driver unit 110 in place of the pre-driver unit 10 (see FIGS. 13, 14). The pre-driver unit 110 includes a P-side pre-driver circuit group 110P and an N-side pre-driver circuit group 110N in place of the P-side pre-driver circuit group 10P and the N-side pre-driver circuit group 10N (see FIGS. 13, 14).

The P-side pre-driver circuit group 110P differs from the basic model in the configuration of realizing the time division outputting function, as illustrated in FIG. 2.

In the first embodiment, the P-side pre-driver circuit group 110P does not have the configurations CFG1 to CFG3 (see FIG. 15) with respect to the P-side pre-driver circuit group 10P of the basic model. On the other hand, in each pre-driver circuit, two transistors NM11, NM12 divided dimensionally are arranged in place of the transistor NM1 for the through-rate control of when turned ON, and a transistor NM13 is further arranged.

FIG. 2 is a view illustrating one example of a configuration of a pre-driver circuit 110P100b.

The pre-driver circuit 110P100b includes the transistors NM11 to NM13.

The transistor NM11 controls the ON speed of the driver transistor 20P100b. The transistor NM11 is electrically connected in parallel with the transistor NM12 between the input node Ninp and the output node Noutp. The transistor NM11 has the drain connected to the output node Noutp, and the source connected to the input node Ninp through the transistors NM4, PM4 and the NOR gate NOR2. The transistor NM11 receives a through-rate control signal ϕirefno at the gate from the control circuit 140 (see FIG. 10). The transistor NM11 thus becomes a half-ON state when receiving the through-rate control signal ϕirefno of intermediate potential at the gate, and equivalently functions as a resistor.

The transistor NM12 controls the ON speed of the driver transistor 20P100b. The transistor NM12 is electrically connected in parallel with the transistor NM11 and in series with the transistor NM13 between the input node Ninp and the output node Noutp. The transistor NM12 has the drain connected to the output node Noutp, and the source connected to the input node Ninp through the transistor NM13, the transistors NM4, PM4 and the NOR gate NOR2. The transistor NM12 receives the through-rate control signal ϕirefno at the gate from the control circuit 140. The transistor NM12 thus becomes a half-ON state when receiving the through-rate control signal ϕirefno of intermediate potential at the gate, and equivalently functions as a resistor.

The transistor NM13 activates or deactivates the transistor NM12. The transistor NM13 is electrically connected in parallel with the transistor NM11 and in series with the transistor NM12 between the input node Ninp and the output node Noutp. The transistor NM13 has the drain connected to the transistor NM12, and the source connected to the input node Ninp through the transistors NM4, PM4 and the NOR gate NOR2. The transistor NM13 receives a time division output control signal ϕovsw- at the gate from the control circuit 140.

For example, when receiving the time division output control signal ϕovsw-of active level (e.g., L level) at the gate, the transistor NM13 is turned OFF thus deactivating the transistor NM12. When receiving the time division output control signal ϕovsw-of non-active level (e.g., H level) at the gate, the transistor NM13 is turned ON thus activating the transistor NM12.

In the pre-driver circuit 110P100b, two transistors NM11, NM12 divided dimensionally are arranged in place of the transistor NM1 for the through-rate control of when turned ON. Assuming the dimension of the transistor NM1 of the basic model is D1 and the dimensions of the transistors NM11, NM12 of the first embodiment are D11, D12, the following equation 2 is satisfied. In other words, the circuit area is substantially equal to each other between the transistor NM1 of the basic model and the transistors NM11, NM12 of the first embodiment.

$$D11+D12=D1 \qquad \text{Equation 2}$$

The pre-driver circuit 110P100b is illustratively described, but other pre-driver circuits 110P18 to 110P100a of the P-side pre-driver circuit group 110P are similar. The N-side pre-driver circuit group 110N has an opposite conductivity-type and is accordingly arranged symmetric to the P-side pre-driver circuit group 110P, and has the NOR gate and the NAND gate interchanged with each other. Other than this aspect, the N-side pre-driver circuit group 110N is similar to the P-side pre-driver circuit group 110P. For example, the pre-driver circuit 110N100b of the N-side pre-driver circuit group 110N is as illustrated in FIG. 2.

In the basic model, the dimension D1 of the transistor NM1 is similar for the plurality of pre-driver circuits 10P18 to 10P100b.

In the first embodiment, the total (D11+D12) of the dimensions of the transistors NM11, NM12 is similar for the plurality of pre-driver circuits 10P18 to 10P100b, but the proportion thereof may differ.

For example, the proportion of the dimension D11 of the transistor NM11 with respect to the dimension D12 of the transistor NM12 in the pre-driver circuit 110P18 is smaller than the proportion of the dimension D11 of the transistor NM11 with respect to the dimension D12 of the transistor NM12 in the pre-driver circuits 110P25, 110P35.

For example, the proportion of the dimension D11 of the transistor NM11 with respect to the dimension D12 of the transistor NM12 in the pre-driver circuits 110P25, 110P35 is smaller than the proportion of the dimension D11 of the transistor NM11 with respect to the dimension D12 of the transistor NM12 in the pre-driver circuits 110P100a, 110P100b.

Assuming the dimensions of the transistor NM11 in the pre-driver circuits 110P18, 110P25, 110P35, 110P100a, 110P100b are Dnm18, Dnm25, Dnm35, Dnm100a, Dnm100b, the plurality of pre-driver circuits 110P18 to 110P100b satisfies the following equation 3, for example.

$$Dnm18 < Dnm25 \approx Dnm35 < Dnm100a \approx Dnm100b \quad \text{Equation 3}$$

In this case, assuming the equivalent resistance of the half-ON state of the transistor NM11 in the pre-driver circuits 110P18, 110P25, 110P35, 110P100a, 110P100b as Rnm18, Rnm25, Rnm35, Rnm100a, Rnm100b, respectively, the following equation 4 is satisfied, for example.

$$Rnm18 > Rnm25 \approx Rnm35 > Rnm100a \approx Rnm100b \quad \text{Equation 4}$$

In this case, for example, the dimension D11 of the transistor NM11 may be smaller than the dimension D12 of the transistor NM12 in the pre-driver circuit 110P18. Furthermore, for example, the dimension D11 of the transistor NM11 may be greater than the dimension D12 of the transistor NM12 in the pre-driver circuits 110P100a, 110P100b.

For instance, the dimension may be changed by changing the channel width while maintaining the channel length equal in the pre-driver circuits 10P18 to 10P100b. As illustrated in 3A of FIG. 3, in the pre-driver circuit 110P18, the channel lengths L1, L2 of the transistors NM11, NM12 may be equal, and the channel width W1 of the transistor NM11 may be narrower than the channel width W2 of the transistor NM12. As illustrated in 3B of FIG. 3, in the pre-driver circuits 110P100a, 110P100b, the channel lengths L3, L4 of the transistors NM11, NM12 may be equal, and the channel width W3 of the transistor NM11 may be wider than the channel width W4 of the transistor NM12.

Alternatively, for example, the dimension may be changed by changing the channel length while maintaining the channel width equal in the pre-driver circuits 10P18 to 10P100b. As illustrated in 4A of FIG. 4, in the pre-driver circuit 110P18, the channel widths W1', W2' of the transistors NM11, NM12 may be equal, and the channel length L1' of the transistor NM11 may be longer than the channel length L2' of the transistor NM12. As illustrated in 4B of FIG. 4, in the pre-driver circuits 110P100a, 110P100b, the channel widths W3', W4' of the transistors NM11, NM12 may be equal, and the channel length L3' of the transistor NM11 may be longer than the channel length L4' of the transistor NM12.

Alternatively, for example, the dimension may be changed by changing both the channel width and the channel length in the pre-driver circuits 10P18 to 10P100b.

Figure 5:
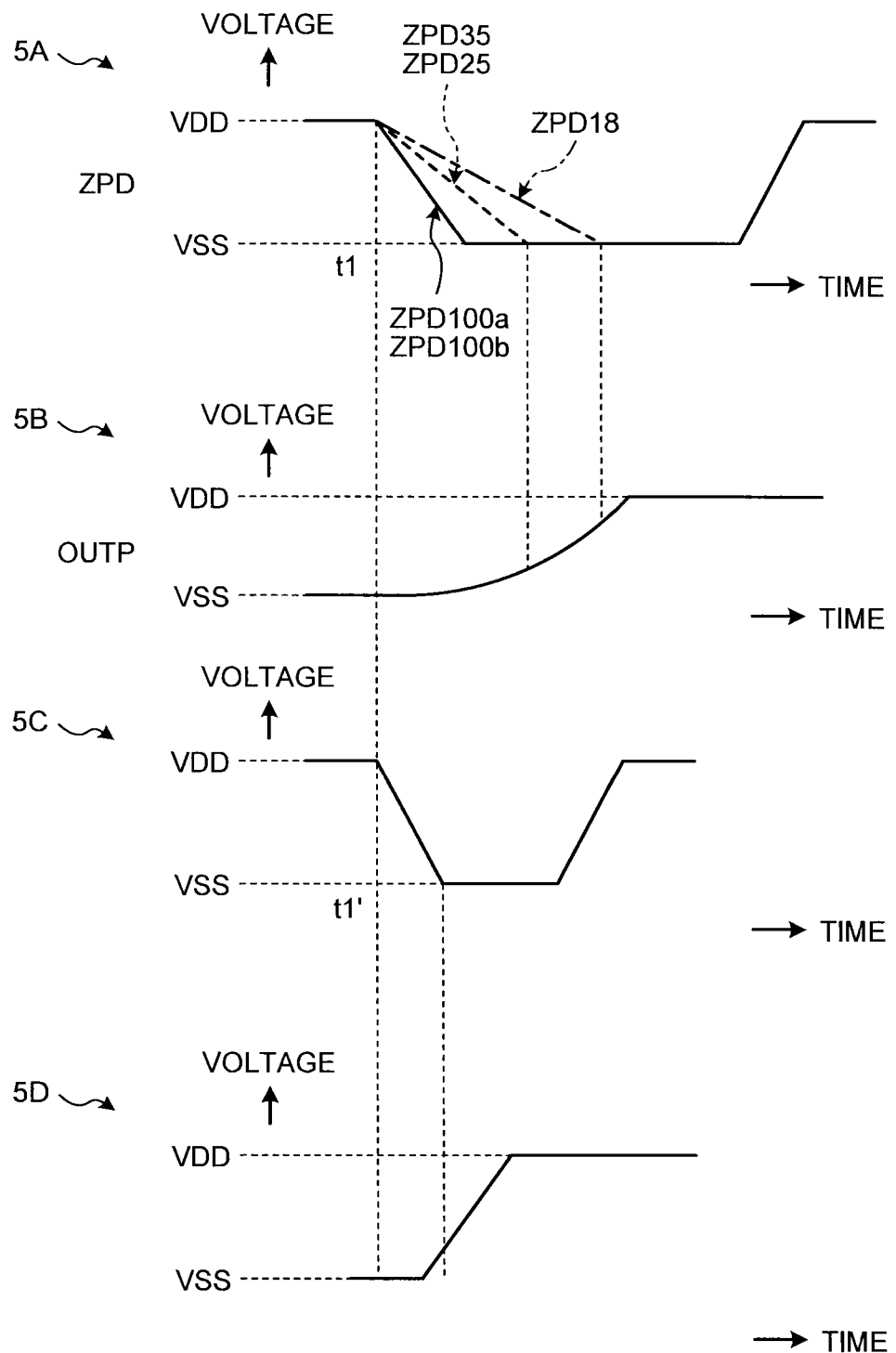
FIG. 5 is a view illustrating an operation of the output circuit according to the first embodiment.

Next, the operation of the output circuit 130 will now be described using FIG. 5. FIG. 5 is a view illustrating an operation of the output circuit 130.

In the P-side pre-driver circuit group 110P, the time division output control signal φovsw- becomes L level when the time division outputting function is activated. The transistor NM13 is thus turned OFF to deactivate the transistor NM12 in each of the pre-driver circuits 110P18 to 110P100b.

Then, as illustrated in 5A of FIG. 5, the plurality of pre-driver circuits 110P18 to 110P100b starts to transition the plurality of driver transistors 20P18 to 20P100b collectively to the ON state at timing t1.

In this case, the transistor NM13 is maintained in a state of deactivating the transistor NM12 in each of the pre-driver circuits 110P18 to 110P100b, and thus the through-rate of the drive control signal is controlled with the equivalent resistance of the transistor NM11 satisfying equation 4 described above.

For example, the resistance of the transistor NM11 is smaller in the pre-driver circuits 110P100a, 110P100b than other pre-driver circuits 110P18 to 110P35. The waveforms of the drive control signals ZPD100a, ZPD100b output to the driver transistors 20P100a, 20P100b become steeper than the other pre-driver circuits 110P18 to 110P35.

The ON speed of the driver transistors 20P100a, 20P100b thus becomes faster than the ON speed of the other driver transistors 20P18 to 20P35.

For example, the resistance of the transistor NM11 is greater in the pre-driver circuits 110P35, 110P25 than the pre-driver circuits 110P100a, 110P100b. The waveforms of the drive control signals ZPD35, ZPD25 output to the driver transistors 20P35, 20P25 become more gradual than the pre-driver circuits 110P100a, 110P100b. Furthermore, the resistance of the transistor NM11 is smaller in the pre-driver circuits 110P100a, 110P100b than the pre-driver circuit 110P18. The waveforms of the drive control signals ZPD100a, ZPD100b output to the driver transistors 20P35, 20P25 becomes steeper than the pre-driver circuits 110P18.

The ON speed of the driver transistors 20P35, 20P25 thus becomes slower than the ON speed of the driver transistors 20P100a, 20P100b, and faster than the ON speed of the driver transistor 20P18.

For example, the resistance of the transistor NM11 is greater in the pre-driver circuit 110P18 than the other pre-driver circuits 110P25 to 110P100b. The waveform of the drive control signal ZPD18 output to the driver transistor 20P18 becomes more gradual than the other pre-driver circuits 110P25 to 110P100b.

The ON speed of the driver transistor 20P18 thus becomes slower than the ON speed of the other driver transistors 20P25 to 20P100b.

In other words, the ON speed of the driver transistors 20P100a, 20P100b, the driver transistors 20P35, 20P25, and the driver transistor 20P18 differs. The waveform of the signal output from the output terminal Tout in the basic model and the waveform of the signal output from the output terminal Tout in the present embodiment are thus similar. In other words, the signal output from the output terminal Tout becomes a gradually rising waveform, as illustrated in 5B of FIG. 5, for example.

In the P-side pre-driver circuit group 110P, the time division output control signal φovsw- becomes H level when the time division outputting function is non-activated. The transistor NM13 is thus turned ON to activate the transistor NM12 in each of the pre-driver circuits 110P18 to 110P100b.

Then, as illustrated in 5C of FIG. 5, the plurality of pre-driver circuits 110P18 to 110P100b starts to collectively turn ON the plurality of driver transistors 20P18 to 20P100b at timing t1'.

In this case, the transistor NM13 is maintained in a state of activating the transistor NM12 in each of the pre-driver circuits 110P18 to 110P100b, and thus the through-rate of the drive control signal is controlled with the resistances equal to each other. The drivability of the P-side driver transistor group 20P thus collectively enhances, and the waveform of the signal output from the output terminal Tout becomes a steeply rising waveform, as illustrated in 5D of FIG. 5, for example.

As described above, in the first embodiment, the transistor NM13 is connected in parallel with the transistor NM11 and in series with the transistor NM12 to activate or deactivate the transistor NM12 in each of the pre-driver circuits 110P18 to 110P100b of the output circuit 130. Thus, when the time division outputting function is activated, the transistor NM13 of each of the pre-driver circuits 110P18 to 110P100b can deactivate the transistor NM12, and equivalently, the plurality of driver transistors 20P18 to 20P100b can start to be turned ON in a time division manner. In other words, the time division outputting function can be realized with a simple configuration in the output circuit 130, and the current flowing to the output circuit 130 can be easily reduced.

For example, in the P-side pre-driver circuit group 110P of the first embodiment, the number of transistors and the number of wiring can be greatly reduced and the capacity load of the logical gate and the capacity load of the wiring can be greatly suppressed since the configurations CFG1 to CFG3 (see FIG. 15) can be reduced compared to the P-side pre-driver circuit group 10P of the basic model. The charging/discharging amount with respect to the capacity load thus can be suppressed, whereby the current flowing to the output circuit 30 can be easily reduced.

Furthermore, in the first embodiment, since the number of transistors and the number of wiring can be greatly reduced, the area of the output circuit 130 can be reduced and the manufacturing cost of the NAND flash memory 3 including the output circuit 130 can be reduced.

In the first embodiment, in each of the pre-driver circuits 110P18 to 110P100b of the output circuit 130, the transistor NM13 deactivates the transistor NM12 when making the pre-driver circuit to the first drivability, and activates the transistor NM12 when making the pre-driver circuit to the second drivability greater than the first drivability. The drivability of each pre-driver circuit of the output circuit 130 thus can be switched with a simple configuration.

In the first embodiment, each of the pre-driver circuits 110P18 to 110P100b includes the transistor NM11, the transistor NM12, and the transistor NM13 in the output circuit 130. The plurality of pre-driver circuits 110P18 to 110P100b can switch the respective drivability, and thus the time division outputting function can be realized without the cooperative operation of the plurality of pre-driver circuits.

In the first embodiment, when the time division outputting function is activated, the plurality of pre-driver circuits 110P18 to 110P100b starts to transition the plurality of driver transistors 20P18 to 20P100b collectively to the ON state with the transistor NM13 deactivating the transistor NM12 in each of the plurality of pre-driver circuits 110P18 to 110P100b. The pre-driver circuits 110P100a, 110P100b turn ON the driver transistors 20P100a, 20P100b, the pre-driver circuits 110P25, 110P35 turn ON the driver transistors 20P25, 20P35 at a slower ON speed, and the pre-driver circuit 110P18 turns ON the driver transistor 20P18 at a still slower ON speed. Thus, the plurality of driver transistors 20P18 to 20P100b can equivalently start to be turned ON in a time division manner.

In the first embodiment, the proportion of the dimension D11 of the transistor NM11 with respect to the dimension D12 of the transistor NM12 in the pre-driver circuit 110P18 is smaller than the proportion of the dimension D11 of the transistor NM11 with respect to the dimension D12 of the transistor NM12 in the pre-driver circuits 110P25, 110P35 of the plurality of pre-driver circuits 110P18 to 110P100b. The proportion of the dimension D11 of the transistor NM11 with respect to the dimension D12 of the transistor NM12 in the pre-driver circuits 110P25, 110P35 is smaller than the proportion of the dimension D11 of the transistor NM11 with respect to the dimension D12 of the transistor NM12 in the pre-driver circuits 110P100a, 110P100b. Thus, in a state the transistor NM3 is deactivating the transistor NM12 in each of the plurality of pre-driver circuits 110P18 to 110P100b, the ON speed can be differed among the driver transistors 20P100a, 20P100b, the driver transistors 20P35, 20P25, and the driver transistor 20P18.

(Second Embodiment)

An output circuit 230 according to a second embodiment will now be described. Hereinafter, portions different from the first embodiment will be centrally described.

In the first embodiment, the pre-driver circuit is configured using the NAND gate and the NOR gate. As illustrated surrounded with a broken line in 7A of FIG. 7, a plurality of PMOS transistors PT1, PT2 is connected in series between the power supply and the output node N in the NOR gate. In FIG. 7, 7A is a view illustrating an internal configuration of the NOR gate used in the first embodiment. In this configuration, the drivability of the plurality of PMOS transistors PT1, PT2 tends to easily drop. In order to ensure the drivability of the plurality of PMOS transistors PT1, PT2, the respective size (=W×L, W: channel width, L: channel length) of the plurality of PMOS transistors PT1, PT2 needs to be made large. In this case, the capacity load of each of the PMOS transistors PT1, PT2 tends to be large, and the charging/discharging amount with respect to such capacity load is required, and hence there is still room to further reduce the current flowing to the output circuit 130.

On the contrary, as illustrated surrounded with a broken line in 7B of FIG. 7, a plurality of PMOS transistors PT3, PT4 is connected in parallel between the power supply and the output node N in the NAND gate. In FIG. 7, 7B is a view illustrating an internal configuration of the NAND gate used in the second embodiment. In the configuration, the drivability of the plurality of PMOS transistors PT3, PT4 tends to easily exhibit. The respective size (=W×L, W: channel width, L: channel length) of the plurality of PMOS transistors PT1, PT2 thus can be suppressed small, and the capacity load of each of the PMOS transistors PT3, PT4 can be reduced. The charging/discharging amount with respect to such capacity load thus can be suppressed, whereby the current flowing to the output circuit 230 can be further reduced.

In the second embodiment, the logical gate is integrated to the NAND gate, and thus the current flowing to the output circuit 230 can be further reduced.

Figure 6:
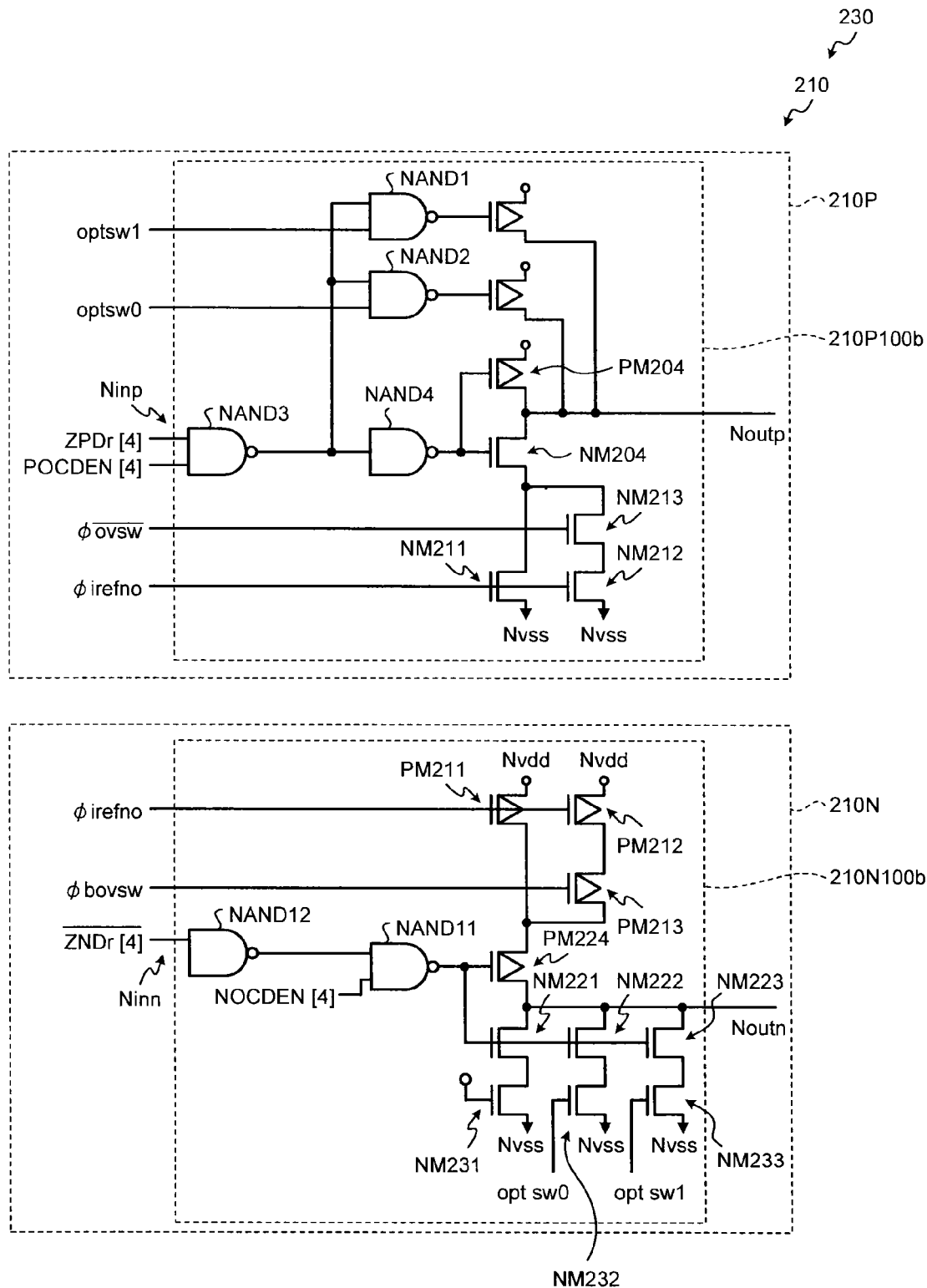
FIG. 6 is a view illustrating a configuration of a pre-driver circuit according to a second embodiment.

Specifically, the output circuit 230 differs from the first embodiment in the P-side pre-driver circuit group 210P and the N-side pre-driver circuit group 210N in the pre-driver unit 210, as illustrated in FIG. 6.

For example, as illustrated in FIG. 6, the P-side pre-driver circuit group 210P includes a pre-driver circuit 210P100b. FIG. 6 is a view illustrating a configuration of the pre-driver circuit 210P100b.

In the second embodiment, two NAND gates NAND3, NAND4 are arranged in place of the NOR gate NOR2 with respect to the pre-driver circuit 110P100b (see FIG. 2) of the first embodiment. In this case, the inverter INV1 (see FIG. 2) can be substituted with the NAND gate NAND3, and hence the inverter INV1 is reduced.

The two NAND gates NAND3, NAND4 are connected in series between the input node Ninp and the output node Noutp in the pre-driver circuit 210P100b. A transfer control signal ZPDr[4] and a control signal POCDEN[4] are input from the control circuit 140 (see FIG. 9) to the NAND gate NAND3 of the initial stage. The NAND gate NAND3 performs the NAND operation of the transfer control signal ZPDr[4] and the control signal POCDEN[4]. The NAND gate NAND3 outputs the operation result to each NAND gate NAND1, NAND2, NAND4. The NAND gate NAND4 has two inputs short-circuit connected, and equivalently functions as an inverter. The NAND gate NAND4 logically inverts the operation result of the NAND gate NAND3 and provides the same to the respective gates of the transistors PM204, NM204.

In this case, the transistor NM211 is electrically connected in parallel with the transistor NM212 between the two NAND gates NAND3, NAND4 and the reference node Nvss and between the output node Noutp and the reference node Nvss.

The transistor NM212 is electrically connected in parallel with the transistor NM211 between the two NAND gates NAND3, NAND4 and the reference node Nvss and between the output node Noutp and the reference node Nvss.

The transistor NM213 is electrically connected in parallel with the transistor NM211 and in series with the transistor NM212 between the two NAND gates NAND3, NAND4 and the reference node Nvss and between the output node Noutp and the reference node Nvss.

The description made above is similar for the other pre-driver circuits in the P-side pre-driver circuit group 210P.

For example, as illustrated in FIG. 6, the N-side pre-driver circuit group 210N includes a pre-driver circuit 210N100b. FIG. 6 is a view illustrating a configuration of the pre-driver circuit 210N100b.

The pre-driver circuit 210N100b of the second embodiment includes the NAND gate NAND12 in place of the NOR gates NOR11, NOR12 and the inverter INV11 with respect to the pre-driver circuit 110N100b (see FIG. 2) of the first embodiment. Furthermore, the pre-driver circuit 210N100b includes transistors NM231 to NM233.

The two NAND gates NAND12, NAND11 are connected in series between the input node Ninn and the output node Noutn in the pre-driver circuit 210N100b. A transfer control signal ZNDr-[4] is input from the control circuit 140 (see FIG. 9) to the NAND gate NAND12 of the initial stage. The transfer control signal ZNDr-[4] is obtained by logically inverting the transfer control signal ZNDr[4]. The NAND gate NAND12 has two inputs short-circuit connected, and equivalently functions as an inverter. The NAND gate NAND12 logically inverts the transfer control signal ZNDr-[4] to generate the transfer control signal ZNDr[4], and provides the same to the NAND gate NAND11.

A control signal NOCDEN[4] is input from the control circuit 140 to the NAND gate NAND11 of the second stage. The NAND gate NAND11 performs the NAND operation of the transfer control signal ZNDr[4] and the control signal NOCDEN[4], and outputs the operation results to the respective gates of the transistors NM221, NM222, NM223.

The transistor NM231 is inserted between the transistor NM221 and the reference node Nvss. The transistor NM231 is supplied with the power supply potential to the gate, and is maintained in the ON state.

The transistor NM232 is inserted between the transistor NM222 and the reference node Nvss. The transistor NM232 has the control signal optsw0 provided to the gate.

The transistor NM233 is inserted between the transistor NM223 and the reference node Nvss. The transistor NM233 has the control signal optsw1 provided to the gate.

In this case, the transistor PM211 is electrically connected in parallel with the transistor PM212 between the two NAND gates NAND12, NAND11 and the power supply node Nvdd and between the output node Noutn and the power supply node Nvdd.

The transistor PM212 is electrically connected in parallel with the transistor PM211 between the two NAND gates NAND12, NAND11 and the power supply node Nvdd and between the output node Noutn and the power supply node Nvdd.

The transistor PM213 is electrically connected in parallel with the transistor PM211 and in series with the transistor PM212 between the two NAND gates NAND12, NAND11 and the power supply node Nvdd and between the output node Noutn and the reference node Nvdd.

The description made above is similar for the other pre-driver circuits in the P-side pre-driver circuit group 210P.

As described above, in the second embodiment, each pre-driver circuit further includes a plurality of NAND gates connected in series with each other between the input node and the output node. Thus, the logical gate can be integrated with the NAND gate in each pre-driver circuit, and thus the current flowing to the output circuit 230 can be further reduced.

In the second embodiment, the circuit area can be reduced since the size (=W×L) of the PMOS transistor in each logical gate can be suppressed small in each pre-driver circuit.

In the second embodiment, the control signal POCDEN is input to the NAND gate of the initial stage in a plurality of NAND gates in the P-side pre-driver circuit. The control signal NOCDEN is input to the NAND gate of the second stage in a plurality of NAND gates in the N-side pre-driver circuit. Thus, the P-side pre-driver circuit and the N-side pre-driver circuit can have the same number of stages for the NAND gate, uniform the properties (e.g., transfer time, etc.) and respectively generate an appropriate signal.

(Third Embodiment)

An output circuit 330 according to a third embodiment will now be described. Hereinafter, portions different from the second embodiment will be centrally described.

In the second embodiment, the drivability of each pre-driver circuit is switched when the transistor NM13 activates or deactivates the transistor NM12 in each pre-driver circuit. In the third embodiment, the switchable range of the drivability of each pre-driver circuit can be further extended.

Figure 8:
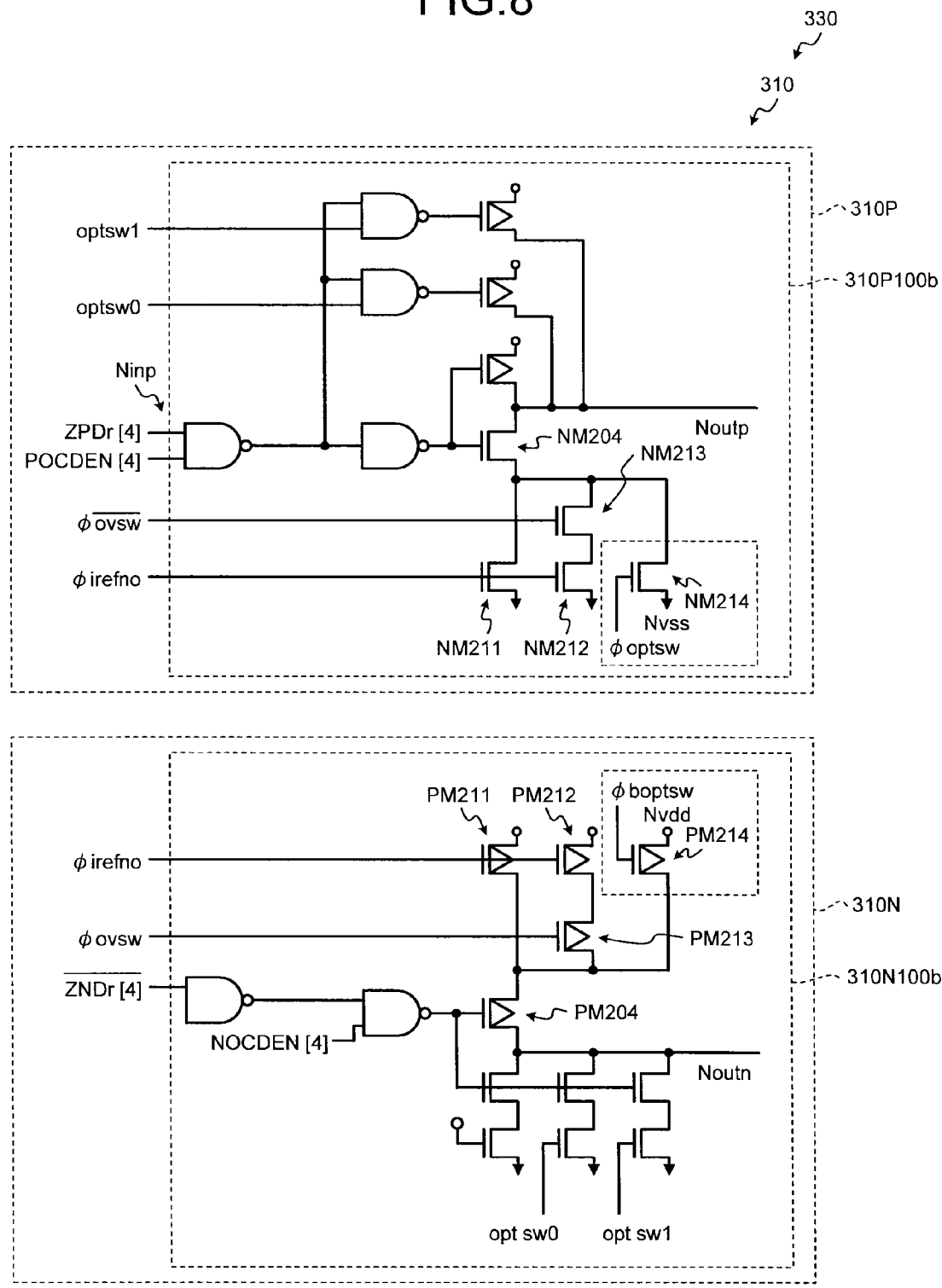
FIG. 8 is a view illustrating a configuration of a pre-driver circuit according to a third embodiment.

Specifically, as illustrated in FIG. 8, the output circuit 330 includes a pre-driver unit 310, and the pre-driver unit 310 includes a P-side pre-driver circuit group 310P and an N-side pre-driver circuit group 310N.

For example, as illustrated in FIG. 8, the P-side pre-driver circuit group 310P includes a pre-driver circuit 310P100b. FIG. 8 is a view illustrating a configuration of the pre-driver circuit 310P100b.

The pre-driver circuit 310P100b further includes a transistor NM214. The transistor NM214 controls the ON speed of the driver transistor 20P100b. The transistor NM214 is electrically connected in parallel with the transistors NM211, NM212, NM213 between the two NAND gates NAND3, NAND4 and the reference node Nvss and between the output node Noutp and the reference node Nvss. The transistor NM214 has the drain connected to the output node Noutp through the transistor NM204, and the source connected to the reference node Nvss. The transistor NM214 has the control signal φoptsw provided to the gate from the control circuit 140 (see FIG. 9).

The control signal φoptsw has a potential closer to the power supply potential VDD than the potential (intermediate potential) of the through-rate control signal φirefpo, and for example, has a potential equal to the power supply potential VDD. The control signal φoptsw, for example, is a signal that transitions between the reference potential VSS and the power supply potential VDD.

The description made above is similar for the other pre-driver circuits in the P-side pre-driver circuit group 310P.

For example, as illustrated in FIG. 8, the N-side pre-driver circuit group 310N includes a pre-driver circuit 310N100b. FIG. 8 is a view illustrating a configuration of the pre-driver circuit 310N100b.

The pre-driver circuit 310N100b further includes a transistor PM214. The transistor PM214 controls the ON speed of the driver transistor 20N100b. The transistor PM214 is electrically connected in parallel with the transistors PM211, PM212, PM213 between the two NAND gates NAND11, NAND12 and the reference node Nvdd and between the output node Noutn and the reference node Nvdd. The transistor PM214 has the drain connected to the output node Noutn through the transistor PM204, and the source connected to the reference node Nvdd. The transistor PM214 has the control signal φboptsw provided to the gate from the control circuit 140.

The control signal φboptsw has a potential closer to the reference potential VSS than the potential (intermediate potential) of the through-rate control signal φirefpo, and for example, has a potential equal to the reference potential VSS. The control signal φboptsw, for example, is a signal that transitions between the reference potential VSS and the power supply potential VDD.

The description made above is similar for the other pre-driver circuits in the N-side pre-driver circuit group 310N.

If a transistor controlled with the through-rate control signal φirefpo is added as a transistor to be added in parallel to the transistors NM211, NM212, NM213, the size of the transistor needs to be made large to increase the drivability of the pre-driver circuit 310P100b to the required level, and hence the circuit area may increase. Furthermore, the number of set levels of the through-rate control signal φirefpo needs to be increased to provide a mode in which the through-rate is fast and a mode in which the through-rate is slow.

In the third embodiment, on the other hand, the transistor NM214 is turned ON in response to the control signal φoptsw having a potential closer to the power supply potential VDD than the intermediate potential in the N-side pre-driver circuit. Thus, the drivability of the pre-driver circuit 310P100b can be increased to the required level while suppressing the size of the transistor small, and for example, the pre-driver circuit 310P100b can have the function of raising the through-rate.

Similarly, the transistor PM214 is turned ON in response to the control signal φboptsw having a potential closer to the reference potential VSS than the intermediate potential in the P-side pre-driver circuit. Thus, the drivability of the pre-driver circuit 310N100b can be increased to the required level while suppressing the size of the transistor small, and for example, the pre-driver circuit 310N100b can have the function of raising the through-rate.

(Fourth Embodiment)

An output circuit according to a fourth embodiment will now be described. Hereinafter, portions different from the basic model will be centrally described.

Figure 17:
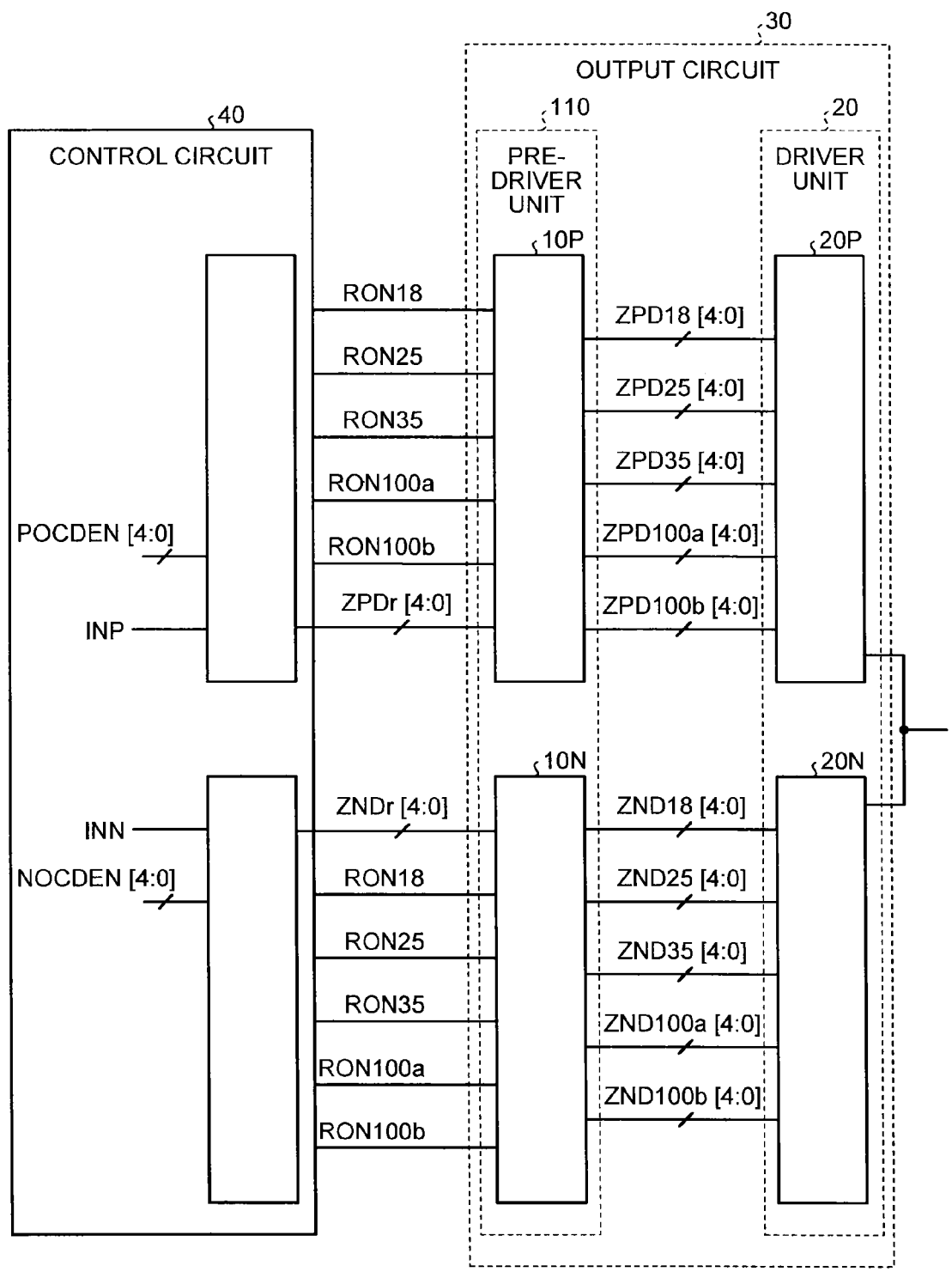
FIG. 17 is a view illustrating a configuration of a control circuit according to the basic model.

As illustrated in FIG. 17, in the basic model, the control circuit 40 generates the transfer control signal ZPDr[4:0] based on the input signal INP and the control signal POCDEN [4:0]. The input signal INP is a signal corresponding to the readout data read out from the memory main unit 60 (see FIG. 11), for example. FIG. 17 is a view illustrating a configuration of a control circuit in the basic model.

Figure 18:
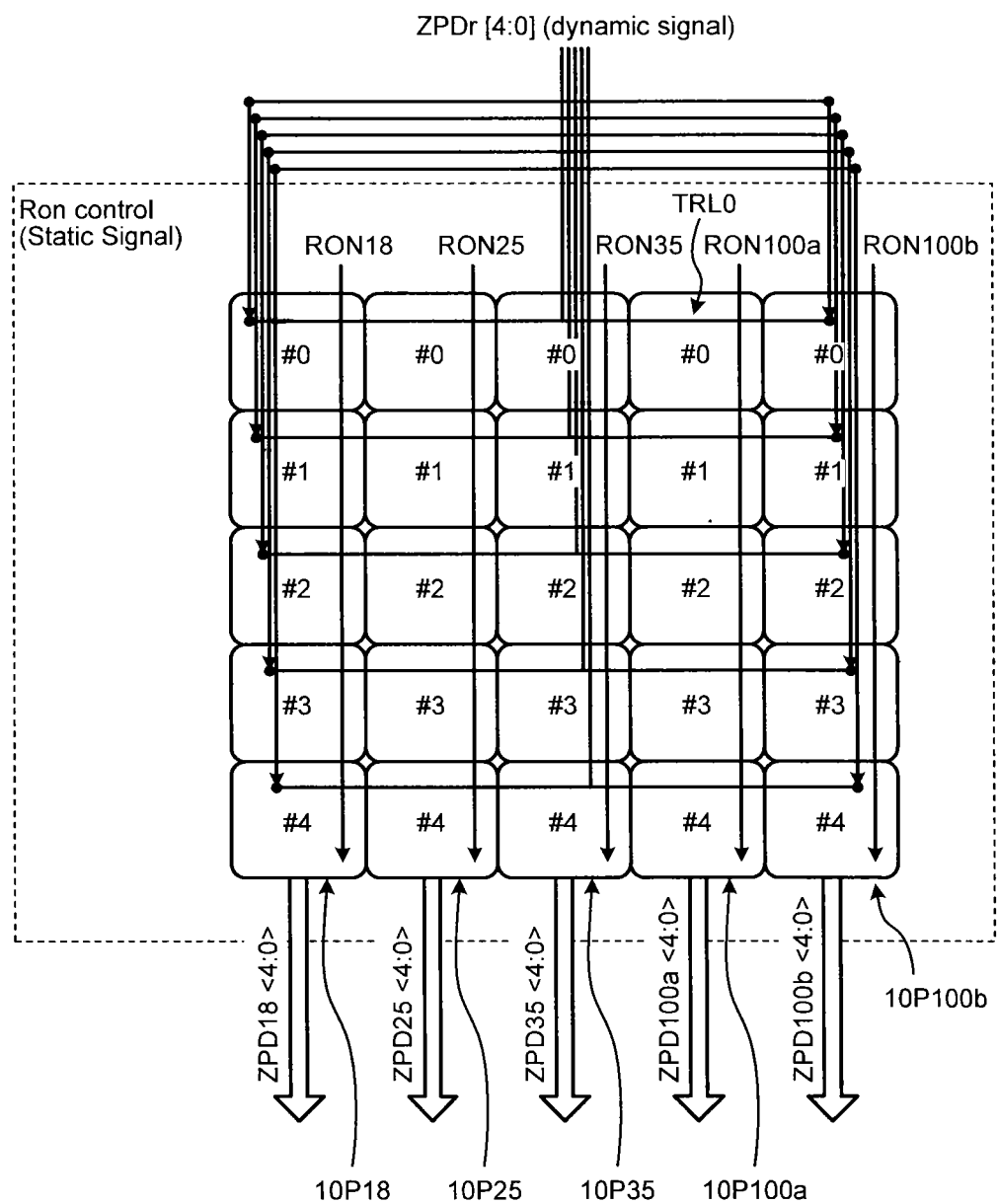
FIG. 18 is a view illustrating a layout configuration of the pre-driver circuit group according to the basic model.

The plurality of pre-driver circuits configures a plurality of groups corresponding to a plurality of ON resistances. For example, as illustrated in FIG. 18, the P-side pre-driver circuit group 10P includes a plurality of pre-driver circuits 10P18-#0 to 10P18-#4 corresponding to the ON resistance Rp18. The P-side pre-driver circuit group 10P includes a plurality of pre-driver circuits 10P25-#0 to 10P25-#4 corresponding to the ON resistance Rp25. The P-side pre-driver circuit group 10P includes a plurality of pre-driver circuits 10P35-#0 to 10P35-#4 corresponding to the ON resistance Rp35. The P-side pre-driver circuit group 10P includes a plurality of pre-driver circuits 10P100a-#0 to 10P100a-#4 corresponding to the ON resistance Rp100a. The P-side pre-driver circuit group 10P includes a plurality of pre-driver circuits 10P100b-#0 to 10P100b-#4 corresponding to the ON resistance Rp100b. FIG. 18 is a view illustrating a layout configuration of the pre-driver circuit group in the basic model.

Specifically, the plurality of pre-driver circuits includes plural rows and plural columns. Each column corresponds to the ON resistance and includes the plurality of pre-driver circuits #0 to #4. For example, the left most column in FIG. 18 corresponds to the ON resistance Rp18 and includes the plurality of pre-driver circuits 10P18-#0 to 10P18-#4. For example, the right most column in FIG. 18 corresponds to the ON resistance Rp100b and includes the plurality of pre-driver circuits 10P100b-#0 to 10P100b-#4.

Which one of #0 to #4 to validate is determined in advance according to the performance of the transistor, and for example, the determination result is stored as a set value in the ROM, and the like before shipment by the manufacturer. The control circuit 40 generates the control signal POCDEN[4:0] according to the determination result. As described above, the control circuit 40 generates the transfer control signal ZPDr [4:0] based on the input signal INP and the control signal POCDEN[4:0].

Accordingly, the output circuit 30 selects the pre-driver circuit to be used in each group corresponding to the ON resistance in accordance with the transfer control signal ZPDr [4:0]. For example, the output circuit 30 provides the transfer control signal to a plurality of trimming lines each extending in a direction along the row to activate or non-activate the trimming line.

Among the rows activated with the trimming, the column corresponding to the ON resistance to be used is selected and enabled according to the ON resistance control signals RON18 to RON100b. For example, the output circuit 30 provides the ON resistance control signals to the pre-driver circuit of every column, and enables the pre-driver circuit to be used.

In this case, each trimming line needs to be charged over all the columns with respect to the transfer control signal ZPDr [4:0]. For example, when validating #0, the trimming line TRL0 corresponding to #0 needs to be charged from the left most column to the right most column in FIG. 18. Thus, the wiring load with respect to the transfer control signal ZPDr[4:0] tends to be large and a great amount of charging/discharging with respect to the wiring load is required, which may increase the current flowing to the output circuit 30.

Figure 9:
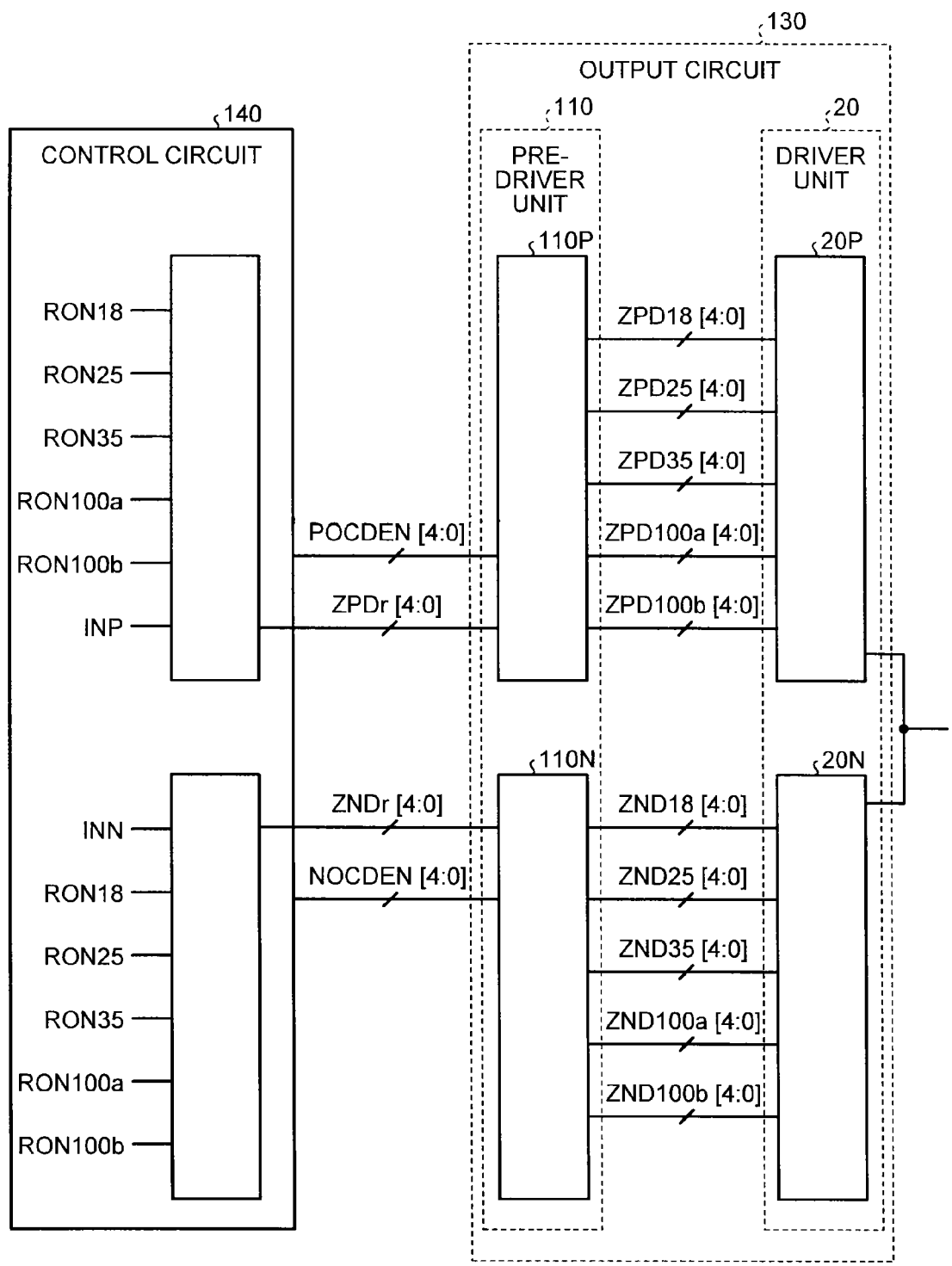
FIG. 9 is a view illustrating a part of a configuration of a control circuit according to a fourth embodiment.

Thus, in the fourth embodiment, the decoding method is changed from 'trimming'→'enable' to 'enable'→'trimming' to reduce the current flowing to the output circuit 130. In other words, as illustrated in FIG. 9, the control circuit 140 generates the transfer control signal ZPDr[4:0] based on the input signal INP and the ON resistance control signals RON18 to RON100b.

Accordingly, the output circuit 130 selects a group corresponding to the ON resistance to be used in a plurality of ON resistances according to the transfer control signal (enable signal) ZPDr[4:0]. For example, the output circuit 130 provides the ON resistance control signal to the pre-driver circuit of every column, and enables the pre-driver circuit to be used.

The output circuit 130 then selects the pre-driver circuit to be used in each enabled group according to the control signal (trimming signal) POCDEN[4:0]. For example, the output circuit 130 provides the control signal to a plurality of trimming lines each extending in a direction along the row to activate or non-activate the trimming line.

Figure 10:
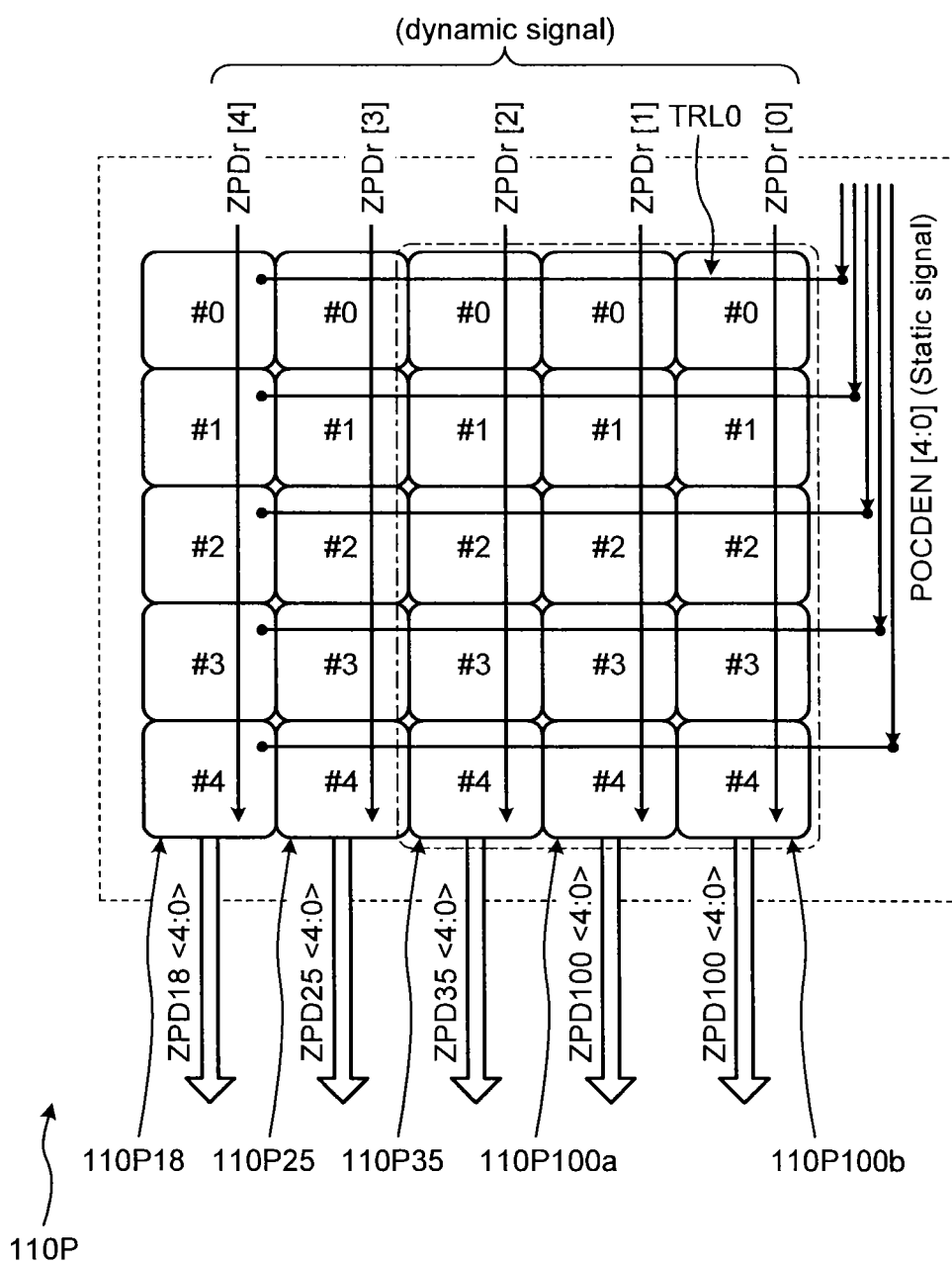
FIG. 10 is a view illustrating a layout configuration of a pre-driver circuit group according to the fourth embodiment.

Specifically, as illustrated in FIG. 10, the output circuit 130 selects one or more columns in the plural columns according to the transfer control signal ZPDr[4:0]. For example, if the ON resistances used as default among the plurality of ON resistances are Rp35, Rp100a, Rp100b, a region surrounded with a chain dashed line is enabled. The output circuit 130 then selects the pre-driver circuit to be used in each of the one or more enabled columns according to the control signal POCDEN[4:0].

In this case, charging for one column is merely carried out with respect to the transfer control signal ZPDr[4:0]. If, for example, the region surrounded by the chain dashed line is enabled, the trimming line is merely charged over some columns (three columns on the right side) with respect to the control signal POCDEN[4:0]. Thus, the wiring load with respect to the transfer control signal ZPDr[4:0] is greatly reduced, and the wiring load with respect to the control signal POCDEN[4:0] is also reduced. The charging/discharging amount with respect to the wiring load thus can be greatly suppressed, whereby the current flowing to the output circuit 130 can be greatly reduced.

As described above, in the fourth embodiment, the output circuit 130 selects the group corresponding to the ON resistance to be used in the plurality of ON resistances, and selects the pre-driver circuit to be used in each selected group. In other words, the output circuit 130 enables one or more columns in the plural columns for an array of a plurality of pre-driver circuits, and trims the pre-driver circuit in each of the one or more enabled columns. Thus, the wiring load with respect to the transfer control signal ZPDr[4:0] is greatly reduced, and the wiring load with respect to the control signal POCDEN[4:0] is also reduced. As a result, the charging/discharging amount with respect to the wiring load can be greatly suppressed, whereby the current flowing to the output circuit 130 can be greatly reduced.

In the fourth embodiment, the output circuit 130 selects the pre-driver circuit to be used based on the transfer control signal (enable signal) ZPDr[4:0], which specifies the group corresponding to the ON resistance, and the control signal (trimming signal) POCDEN[4:0], which specifies the pre-driver circuit to be used in each enabled group. The output circuit 130 thus can carry out decoding of 'enable'→'trimming'.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output circuit comprising
a driver transistor connected to an output terminal; and
a pre-driver circuit configured to turn ON/OFF the driver transistor; wherein
the pre-driver circuit includes
a first transistor configured to control ON speed of the driver transistor,
a second transistor connected in parallel with the first transistor, and configured to control ON speed of the driver transistor, and
a third transistor connected in parallel with the first transistor and in series with the second transistor, and configured to activate or deactivate the second transistor,
a plurality of the driver transistors, and
a plurality of the pre-driver circuits corresponding to the plurality of driver transistors; wherein
each of the plurality of pre-driver circuits includes the first transistor, the second transistor, and the third transistor.

2. The output circuit according to claim 1, wherein
when the plurality of pre-driver circuits starts to transition the plurality of driver transistors to ON state with the third transistor deactivating the second transistor in each of the plurality of pre-driver circuits, a first pre-driver circuit turns ON a first driver transistor at a first ON speed, and a second pre-driver circuit turns ON a second driver transistor at a second ON speed slower than the first ON speed.

3. The output circuit according to claim 1, wherein
the first transistor is electrically connected between an input node in the pre-driver circuit and an output node in the pre-driver circuit;
the second transistor is electrically connected in parallel with the first transistor between the input node and the output node; and
the third transistor is electrically connected in parallel with the first transistor and in series with the second transistor between the input node and the output node.

4. The output circuit according to claim 1, wherein
the pre-driver circuit further includes a plurality of NAND gates connected in series with each other between an input node in the pre-driver circuit and an output node in the pre-driver circuit.

5. The output circuit according to claim 4, wherein
the first transistor is electrically connected between the plurality of NAND gates and a reference node and between the output node and the reference node;
the second transistor is electrically connected in parallel with the first transistor between the plurality of NAND gates and the reference node and between the output node and the reference node; and
the third transistor is electrically connected in parallel with the first transistor and in series with the second transistor between the plurality of NAND gates and the reference node and between the output node and the reference node.

6. The output circuit according to claim 4, further comprising, as the pre-driver circuit, a P-side pre-driver circuit and an N-side pre-driver circuit; wherein
the plurality of NAND gates in the P-side pre-driver circuit has a first control signal input to a NAND gate of an initial stage.

7. The output circuit according to claim 4, further comprising, as the pre-driver circuit, a P-side pre-driver circuit and an N-side pre-driver circuit; wherein
the plurality of NAND gates in the N-side pre-driver circuit has a first control signal input to a NAND gate of a second stage.

8. The output circuit according to claim 1, wherein
the first transistor and the second transistor are respectively turned ON in response to a second control signal having an intermediate potential between a reference potential and a power supply potential.

9. The output circuit according to claim 8, wherein
the pre-driver circuit further includes a fourth transistor, the fourth transistor being connected in parallel with the first transistor, the second transistor, and the third transistor, the fourth transistor being configured to control ON speed of the driver transistor; and
the fourth transistor is turned ON in response to a third control signal having a potential closer to the reference potential or the power supply potential than the intermediate potential.

10. The output circuit according to claim 9, further comprising, as the pre-driver circuit, a P-side pre-driver circuit and an N-side pre-driver circuit; wherein
the fourth transistor in the P-side pre-driver circuit is an NMOS transistor and is turned ON in response to the third control signal having a potential equal to the power supply potential.

11. The output circuit according to claim 9, further comprising, as the pre-driver circuit, a P-side pre-driver circuit and an N-side pre-driver circuit; wherein
the fourth transistor in the N-side pre-driver circuit is a PMOS transistor and is turned ON in response to the third control signal having a potential equal to the reference potential.

12. The output circuit according to claim 1, wherein
a plurality of ON resistances corresponding to the plurality of driver transistors includes a first ON resistance and a second ON resistance higher than the first ON resistance;
the plurality of pre-driver circuits configures a plurality of groups corresponding to the plurality of ON resistances; and
the output circuit selects a group corresponding to an ON resistance to be used in the plurality of ON resistances, and selects a pre-driver circuit to be used in each selected group.

13. The output circuit according to claim 12, wherein
the plurality of pre-driver circuits is arrayed to configure plural rows and plural columns, the plural columns corresponding to ON resistances of the plurality of driver transistors; and
the output circuit selects one or more columns in the plural columns and selects a pre-driver circuit in each of the one or more enabled columns.

14. The output circuit according to claim 12, wherein
the output circuit selects the pre-driver circuit to be used, based on an enable signal which specifies the group corresponding to the ON resistance, and a trimming signal which specifies the pre-driver circuit to be used in each enabled group.

15. The output circuit according to claim 12, wherein
the output circuit determines the ON resistance to be used in accordance with an externally input command among the plurality of ON resistances.

16. The output circuit according to claim 12, wherein
the output circuit determines the pre-driver circuit to be used according to a set value determined in advance.

17. A semiconductor storage device comprising:
the output circuit according to claim 1; and
a controller configured to control the output circuit, wherein
the output circuit outputs data read out from a NAND memory cell to the controller.

* * * * *